(12) United States Patent
Jeong

(10) Patent No.: US 6,586,336 B2
(45) Date of Patent: Jul. 1, 2003

(54) CHEMICAL-MECHANICAL-POLISHING STATION

(75) Inventor: In Kwon Jeong, Sunnyvale, CA (US)

(73) Assignee: Oriol, Inc., Santa Clara, CA (US)

( * ) Notice: Subject to any disclaimer, the term of this patent is extended or adjusted under 35 U.S.C. 154(b) by 117 days.

(21) Appl. No.: 09/943,946

(22) Filed: Aug. 31, 2001

(65) Prior Publication Data

US 2003/0045107 A1 Mar. 6, 2003

(51) Int. Cl.$^7$ ............................................. H01L 21/00
(52) U.S. Cl. ................... 438/692; 156/345.12; 216/38; 216/88; 438/745
(58) Field of Search .......................... 438/691, 692, 438/693, 745; 216/38, 88, 89, 91; 156/345.12; 451/36, 66; 134/1.3

(56) References Cited

U.S. PATENT DOCUMENTS

| | | | |
|---|---|---|---|
| 3,913,271 A | 10/1975 | Boettcher | 51/5 R |
| 4,128,968 A | 12/1978 | Jones | 51/54 |
| 4,956,944 A | 9/1990 | Ando et al. | 51/165.71 |
| 5,542,874 A | 8/1996 | Chikaki | 451/158 |
| 5,738,574 A | 4/1998 | Tolles et al. | 451/288 |
| 5,804,507 A | 9/1998 | Perlov et al. | 438/692 |
| 5,827,110 A | 10/1998 | Yajima et al. | 451/5 |
| 5,830,454 A | 11/1998 | Renauld et al. | 424/85.2 |
| 5,885,138 A | 3/1999 | Okumura et al. | 451/67 |
| 5,899,738 A | 5/1999 | Wu et al. | 438/618 |
| 5,924,916 A | 7/1999 | Yamashita | 451/288 |
| 5,944,582 A | 8/1999 | Talieh | 451/41 |
| 5,951,373 A | 9/1999 | Shendon et al. | 451/41 |
| 6,036,582 A | 3/2000 | Aizawa et al. | 451/41 |
| 6,062,954 A | 5/2000 | Izumi | 451/72 |
| 6,106,369 A | 8/2000 | Konishi et al. | 451/41 |
| 6,136,138 A | 10/2000 | Yagisawa | 156/345 |
| 6,136,715 A | 10/2000 | Shendon et al. | 438/692 |
| 6,140,224 A | 10/2000 | Lin | 438/634 |
| 6,159,080 A | 12/2000 | Talieh | 451/41 |
| 6,168,683 B1 | 1/2001 | Cesna | 156/345 |
| 6,179,695 B1 | 1/2001 | Takahashi et al. | 451/287 |
| 6,227,946 B1 | 5/2001 | Gonzalez-Martin et al. | 451/54 |
| 6,241,585 B1 | 6/2001 | White | 451/41 |

Primary Examiner—William A. Powell
(74) Attorney, Agent, or Firm—McKenna Long & Aldridge LLP

(57) ABSTRACT

A small footprint, integrated and automated semiconductor wafer processing system for planarizing semiconductor wafers. That processing system includes a wafer load station, at least one CMP polishing system, and at least one cleaning system. Also included is at least one wafer unload station and a robotic system. The robotic system, which includes from two to six robotic movers, moves semiconductor wafers through the semiconductor wafer processing system. The semiconductor wafer processing system can also include a buffer system for temporarily holding semiconductor wafers. The buffer system, the robotic system, the cleaning system, the wafer load station, and/or the wafer unload station in some applications are capable of Z-axis motion. CMP polishing systems and cleaning systems can be vertically or linearly stacked.

283 Claims, 17 Drawing Sheets

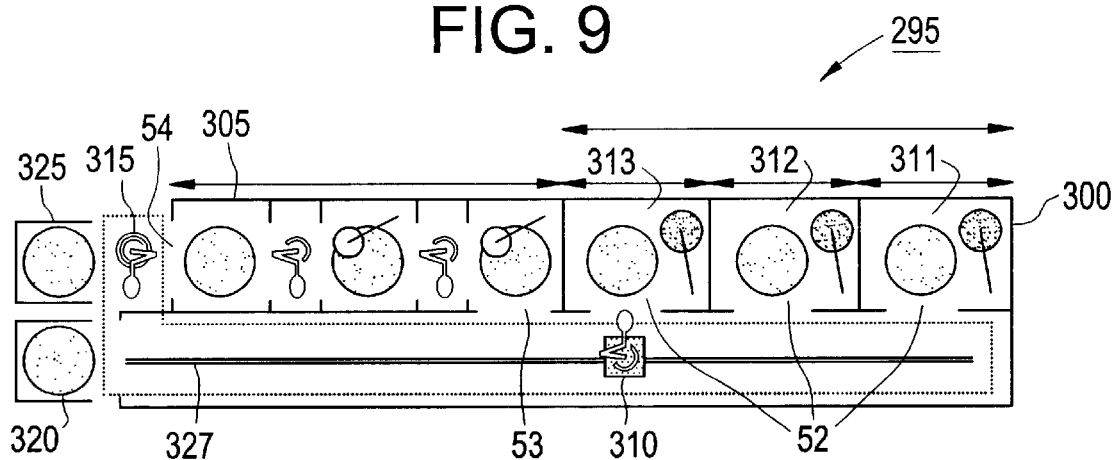
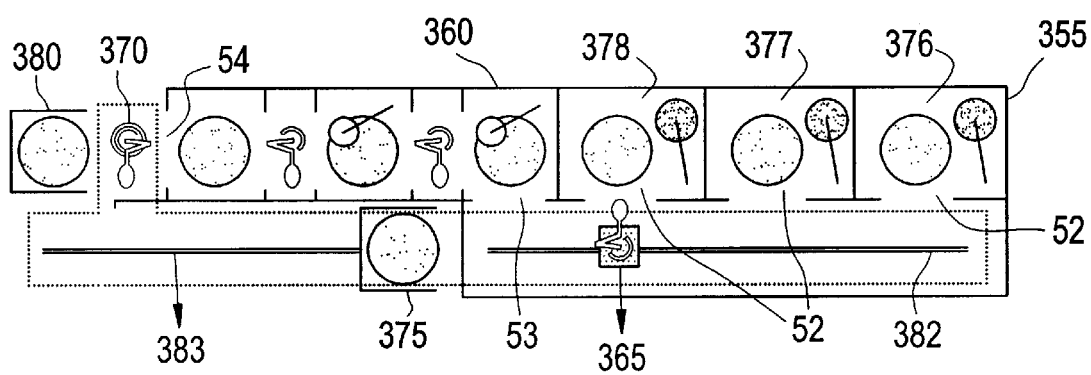

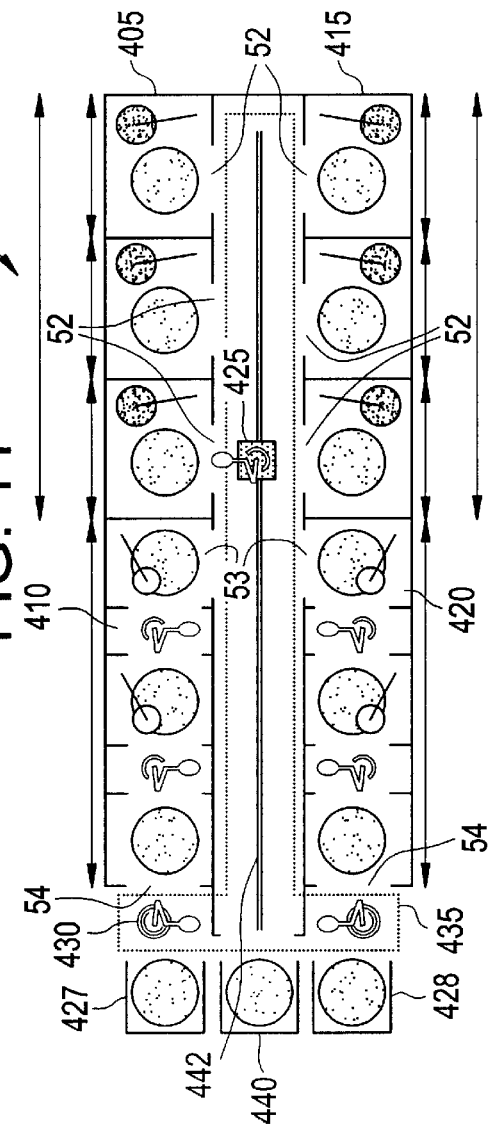
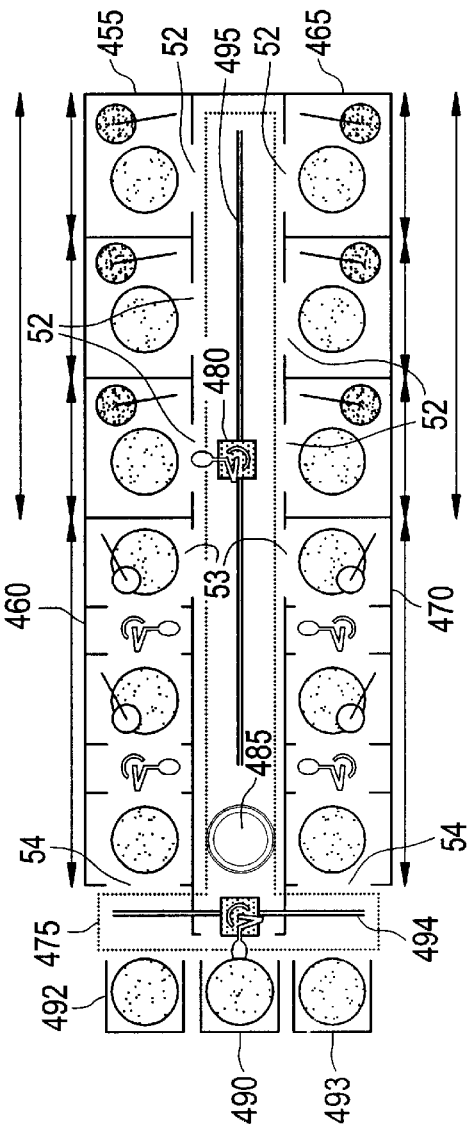

CHEMICAL-MECHANICAL-POLISHING STATION

BACKGROUND OF THE INVENTION

1. Field of the Invention

Semiconductor manufacturing is a highly competitive industry. Success requires the ability to produce high quality, high reliability semiconductor devices at low cost. That requires an ability to rapidly fabricate complex devices at high speed and with high yields.

2. Discussion of the Related Art

Semiconductor manufacturing is a highly competitive industry. Success requires the ability to produce high quality, high reliability semiconductor devices at low cost. That requires an ability to rapidly fabricate complex devices at high speed and with high yields.

The fabrication of a semiconductor device begins with a semiconductor wafer. Such wafers are made by carefully growing a large semiconductor crystal, and then slicing that crystal into individual wafers. For storage and protection the sliced wafers are usually loaded into wafer cassettes. A wafer cassette individually stacks sliced semiconductor wafers in slots. Wafer cassettes are beneficial in that the large numbers of semiconductor wafers can be stored and transported in a protected environment.

Unfortunately, immediately after slicing a semiconductor wafer is unsuitable for fabricating semiconductor devices because the cutting leaves rough surfaces. Surface roughness is a problem because modern fabrication processes require accurate focusing of photolithographic circuit patterns of the semiconductor wafer. As the density of integrated circuits increases, focus tolerances better than 0.1 □meters can be required. Focusing with such small tolerances is not practical if the surface of a semiconductor wafer not highly planar.

A number of techniques for reducing surface roughness exist. In practice, a semiconductor wafer can be mechanically worked by an abrasive pad to produce a fairly smooth surface. However, as indicated above, the surface of a semiconductor wafer needs to be rendered exceptionally smooth.

One technique that can finish the surface of a semiconductor wafer to the required smoothness is Chemical-Mechanical Polishing ("CMP"). In CMP, a semiconductor wafer is mechanically and chemically worked under carefully controlled conditions. Such work is performed using a special abrasive substance that is rubbed over the surface of the semiconductor wafer. The special abrasive substance is typically slurry containing minute particles that abrade, and chemicals that etch, dissolve, and/or oxidize the surface of the wafer.

The mechanical work is performed by polishing pads. By inducing relative motion between a polishing pad and a semiconductor wafer, and by using the abrasive substance, the surface of the semiconductor wafer is planarized.

In addition to mechanically and chemically working a semiconductor wafer, a complete CMP process requires careful cleaning and drying of the semiconductor wafer, and testing to ensure the smoothness and electrical characteristics of the semiconductor wafer. Cleaning and drying is beneficially performed without contaminating the semiconductor wafer. Testing is typically performed using a metrology station. Thus, a functional CMP process requires removing semiconductor wafers from a wafer cassette, CMP polishing, cleaning, drying, testing, and then storing completed semiconductor wafers in a wafer cassette.

Obviously, each of the foregoing process functions involve moving semiconductor wafers from one processing station to the next. To reduced cost, and to avoid damage and contamination, such movement is beneficially performed robotically.

Therefore, a complete CMP process includes a Chemical-Mechanical Polishing system, a cleaning system (which beneficially includes a metrology station), and motion inducing devices that move semiconductors wafers from a starting station, through the CMP process, and to an ending station.

There are many well-known stations that can be used to implement a CMP process. For example, FIG. 1 schematically illustrates a conventional Chemical-Mechanical Polishing system in the form of a mini-polisher 10. That polisher includes a large pad 14 on the end of a rotated shaft 16. A semiconductor wafer 20 is located on the large pad 14. A small amount of a special abrasive substance 23 is placed over the surface of the semiconductor wafer 20. Then, a small pad 30 on the end 32 of a rotating small shaft 36 is brought into contact with the surface of the semiconductor wafer 20. Rotation-induced mechanical abrasion, combined with chemical action, polish the semiconductor wafer. Such CMP systems are well known, reference U.S. Pat. Nos. 5,542,874; 5,944,582; and 6,106,369, all of which are hereby incorporated by reference.

While mini-polishers can produce high quality planar surfaces on semiconductor wafers, a mini-polisher requires a relatively long polishing time when compared to polishers that use large pads. However, U.S. Pat. Nos. 6,169,693 and 6,062,594 disclose polishing systems that use multiple polishing stations.

In particular, U.S. Pat. No. 6,062,594 discloses a system having three mini-polishers. A semiconductor wafer is polished at a first station, then by the second, and finally by the third. Such serial polishing can dramatically increase throughput. However, serially moving a semiconductor wafer from one station to the next might not be optimal. Furthermore, the internal mechanisms of transferring the semiconductor wafers also might not be optimal.

In any event, a typical cleaning system for polished semiconductor wafers includes three cleaning stations. In the first and second cleaning stations, the slurry particles are removed by mechanical contact with brushes. In the first cleaning station $NH_4OH$ containing de-ionized water can be used to remove particles. In the second cleaning station, a dilute HF solution can be used to lightly etch the semiconductor wafer's surface while removing contaminates and slurry. In the third cleaning station, the semiconductor wafer is rinsed with de-ionized water and dried. While three cleaning stations are typical, the actual number and composition of cleaning stations can vary. But, 2, 3, or 4 stations are the most common.

As semiconductor manufacturing is highly competitive, it is desirable to maximize the rate of polishing semiconductor wafers, while simultaneously minimizing the number of defects. To reduce cost, an automated CMP process is beneficially. Furthermore, as CMP processes tend to be expensive, it is highly desirable to efficiently utilize the systems that comprise the CMP process. Thus, it is desirable to maximize the number of finished semiconductor wafers per hour.

Furthermore, as CMP is typically performed in a clean room, and as clean rooms are expensive, and as that expense tends to increase with the size of the clean room, it is very desirable to minimize the size of the clean room. Minimizing the clean room size requires efficient space utilization. Thus, a CMP system ideally should have a small footprint. In order to achieve a small footprint, the CMP polisher system, the cleaner system, and the input/output and motion inducing systems should be considered together.

In view of the foregoing, it is obvious that a new, integrated CMP system that implements the CMP process would be beneficial. Even more beneficial would be a new, integrated and automated CMP system. More beneficial yet would be a new, automated integrated CMP system having a reduced footprint. Still more beneficial would be a new, automated integrated CMP system that enables a small footprint and that has a high throughput.

SUMMARY OF THE INVENTION

Accordingly, the principles of the present invention provide for a new, integrated CMP process. Those principles further provide for a new, automated integrated CMP process that can be implemented with a small footprint and with a high throughput.

To achieve these and other advantages and in accordance with the purpose of the present invention, as embodied and broadly described, a semiconductor wafer processing system according to the principles of the present invention includes a wafer load station for receiving semiconductor wafers stored in a first wafer load cassette, at least one CMP polishing system for polishing the semiconductor wafers, and at least one multi-station cleaning system for cleaning the polished semiconductor wafers. Also included is at least one unload station for receiving polished and cleaned semiconductors and a robotic system. In some applications there are multiple CMP polishing systems, multi-station cleaning systems, and/or multiple unload stations. In some applications, multiple CMP polishing systems are vertically stacked. In some applications the wafer load and wafer unload stations are capable of vertical motion. In some applications the wafer load station is track mounted. In some applications a multi-station cleaning system includes a metrology station. In some applications a multi-station cleaning system is vertically stacked. Some applications have a buffer station, which can include vertically stacked buffer plates. In some applications the buffer station is capable of vertical motion.

The robotic system includes a first robotic mover. In some applications the first robotic mover moves semiconductor wafers from the wafer load station into the CMP polishing system. In some applications the first robotic mover moves semiconductor wafers from the wafer load station into a buffer station, which can include a plurality of vertically stacked buffer plates. In some applications the first robotic mover moves semiconductor wafers from the CMP polishing system into the multi-station cleaning system. In some applications the first robotic mover moves semiconductor wafers from the CMP polishing system into the buffer station. In some applications the first robotic mover moves semiconductor wafers from a station of the CMP polishing system into another station of the CMP polishing system. In some applications the first robotic mover is track mounted. In some applications, the first robotic mover is capable of Z-axis motion. In some applications the first robotic mover moves semiconductor wafers from the multi-station cleaning system to an unload station.

The robotic system also includes a second robotic mover. In some applications, the second robotic mover moves polished semiconductor wafers from a buffer station into the multi-station cleaning system. In some applications the second robotic mover moves semiconductor wafers from a buffer station to a CMP polishing system. In some applications the second robotic mover moves semiconductor wafers from a CMP polishing system to a buffer station. In some applications the second robotic mover is capable of Z-axis motion.

The robotic system can also includes a third robotic mover. In some applications, the third robotic mover moves polished semiconductor wafers from a buffer station into a multi-station cleaning system. In some applications the third robotic mover moves semiconductor wafers from a CMP polishing system to a multi-station cleaning system. In some applications the third robotic mover moves semiconductor wafers from a multi-station cleaning system to a wafer unload station. In some applications the third robotic mover is capable of Z-axis motion.

The robotic system can also includes a fourth robotic mover. In some applications, the fourth robotic mover moves polished semiconductor wafers from a buffer station into a multi-station cleaning system. In some applications the fourth robotic mover moves semiconductor wafers from a CMP polishing system to a multi-station cleaning system. In some applications the fourth robotic mover moves semiconductor wafers from a multi-station cleaning system to a wafer unload station. In some applications the fourth robotic mover is capable of Z-axis motion.

The robotic system can also includes a fifth robotic mover for moving polished and cleaned semiconductor wafers from a multi-station cleaning system into a wafer unload station. In some applications the fifth robotic mover is on a track.

The robotic system can also includes a sixth robotic mover for moving polished and cleaned semiconductor wafers from a multi-station cleaning system into a wafer unload station.

A method of polishing semiconductor wafers according to the principles of the present invention includes receiving a semiconductor wafer having a surface area at a load station. Then, transferring the received semiconductor wafer from the load station to a polishing station. The method further includes polishing the received semiconductor wafer using a polishing pad and a chemical slurry, wherein the polishing pad contacts less than the first surface area. Then, transferring the polished semiconductor wafer from the polishing station to a cleaning station. At the cleaning station the polished semiconductor wafer is cleaned, rinsed, and dried. Finally, transferring the dried semiconductor wafer from the cleaning station to an unload station. In some applications the semiconductor wafers will be moved vertically, and/or semiconductor parameter measurements will be taken of the semiconductor wafers.

Another method of polishing semiconductor wafers according to the principles of the present invention includes receiving semiconductor wafers, each having a surface area, at a wafer load station. Then, selectively transferring the semiconductor wafers from the wafer load station to a first CMP polishing station or to a second CMP polishing station. Then, polishing the semiconductor wafers in the first or second CMP polishing stations using a polishing pad and a chemical slurry, wherein the polishing pad contacts less than the surface area. Then, transferring the polished semiconductors from the first or second CMP polishing station to a first or second cleaning station. Then, cleaning the polished semiconductor wafers and unloading them to a first or second unload station. In some applications the semiconductor wafers will be moved vertically, and/or semiconductor parameter measurements will be taken of the semiconductor wafers.

Another method of polishing semiconductor wafers according to the principles of the present invention includes receiving semiconductor wafers, each having a surface area, at a wafer load station, and then transferring the received semiconductor wafers from the wafer load station to a buffer station that temporarily retains the semiconductor wafers. Then, selectively transferring semiconductor wafers from the buffer station to a first CMP polishing station or to a second CMP polishing station. Then, polishing the semiconductor wafers in the first or second CMP polishing stations using a polishing pad and a chemical slurry, wherein the polishing pad contacts less than the surface area. Then, transferring the polished semiconductors from the first or second CMP polishing station to a first or second cleaning station. Then, cleaning the polished semiconductor wafers and unloading them to a first or second unload station. In some applications the semiconductor wafers will be moved vertically, and/or semiconductor parameter measurements will be taken of the semiconductor wafers.

Yet another method of polishing semiconductor wafers according to the principles of the present invention includes receiving semiconductor wafers, each having a surface area, at a wafer load station,, and then transferring the received semiconductor wafers from the wafer load station to a buffer station that temporarily retains the semiconductor wafers. Then, selectively transferring semiconductor wafers from the buffer station to a first CMP polishing station or to a second CMP polishing station. Then, polishing the semiconductor wafers in the first or second CMP polishing stations using a polishing pad and a chemical slurry, wherein the polishing pad contacts less than the surface area. Then, transferring the polished semiconductor wafers from the first or second CMP polishing stations to the buffer station for temporary storage. Then, selectively transferring semiconductor wafers from the buffer station to a first cleaning station or to a second cleaning station. Then, cleaning the polished semiconductor wafers and then unloading the cleaned and polished semiconductor wafers to a first unload station or to a second unload station.

Still another method of polishing semiconductor wafers according to the principles of the present invention includes receiving semiconductor wafers, each having a surface area, at a wafer load station, and then transferring the received semiconductor wafers from the wafer load station to a buffer station that temporarily retains the semiconductor wafers. Then, selectively transferring semiconductor wafers from the buffer station to a CMP polishing station. Then, polishing the semiconductor wafers in the CMP polishing station using a polishing pad and a chemical slurry, wherein the polishing pad contacts less than the surface area. Then, transferring the polished semiconductor wafers from the CMP polishing station to a cleaning station. Then, cleaning polished semiconductor wafers at the cleaning station; and unloading the polished and cleaned semiconductor wafers station to an unload station.

Additional features and advantages of the invention will be set forth in the description that follows, will be apparent from the description and/or the figures, or may be learned by practice of the invention.

BRIEF DESCRIPTION OF THE DRAWING

The accompanying drawings, which are included to provide a further understanding of the principles of the present invention, are incorporated in and constitute a part of this specification. The principles of the present invention may be better understood by reading the following detailed descriptions of the illustrated embodiments, with reference to the accompanying drawings, wherein:

FIG. 9 is a schematic top-down view of a CMP system that is in accord with a third embodiment of the present invention;

FIG. 10 is a schematic top-down view of a CMP system that is in accord with a fourth embodiment of the present invention;

FIG. 11 is a schematic top-down view of a CMP system that is in accord with a fifth embodiment of the present invention;

FIG. 13 is a schematic top-down view of a CMP system that is in accord with a sixth embodiment of the present invention;

DETAILED DESCRIPTION OF THE ILLUSTRATED EMBODIMENTS

The principles of the present invention provide for automated and integrated CMP systems that can planarize semiconductor wafers with high quality finishes in a manner that provides for high throughput and with a small footprint. Such automated and integrated systems include robotic movers, at least one CMP polishing system (beneficially including a mini-polisher) and a cleaning system. While numerous CMP system embodiments are subsequently explained, it should be understood that many obvious modifications to the illustrated embodiments are possible. Therefore, the principles of the present invention are to be limited only by the claims and their equivalents in accordance with United States Patent Laws.

According to the principles of this invention, an automated and integrated CMP system is comprised of at least one CMP polishing system (beneficially including a mini-polisher station), at least one cleaning system (typically a multi-station cleaning system), at least one wafer load station, at least one wafer unload station, and a robotic mover system. Additional features can include at least one buffer station for temporarily holding a semiconductor wafer and a metrology station for testing polished and cleaned semiconductor wafers. The metrology station is beneficially a part of a multi-station cleaning system.

A CMP polishing system beneficially includes at least one polishing station that uses at least one small pad. A cleaning system beneficially includes at least one internal wafer transfer mechanism for transferring semiconductor wafers within the cleaning system, and may contain a metrology station. The wafer load station includes a wafer load mechanism for receiving semiconductor wafers in at least one wafer load cassette unit. The wafer unload station includes a wafer unload mechanism for receiving cleaned and polished semiconductor wafers in an unload cassette unit. The robotic mover system is for moving semiconductor wafers from the wafer load station to the CMP polishing system, to the cleaning system, and to the wafer unload station. Additionally, the robotic mover system might move semiconductor wafers from one polishing station to another. The wafer load station and/or the wafer unload station might includes mechanisms for handling multiple cassettes, such as by displacing cassettes vertically, and/or might be movable along tracks.

Figure 1:
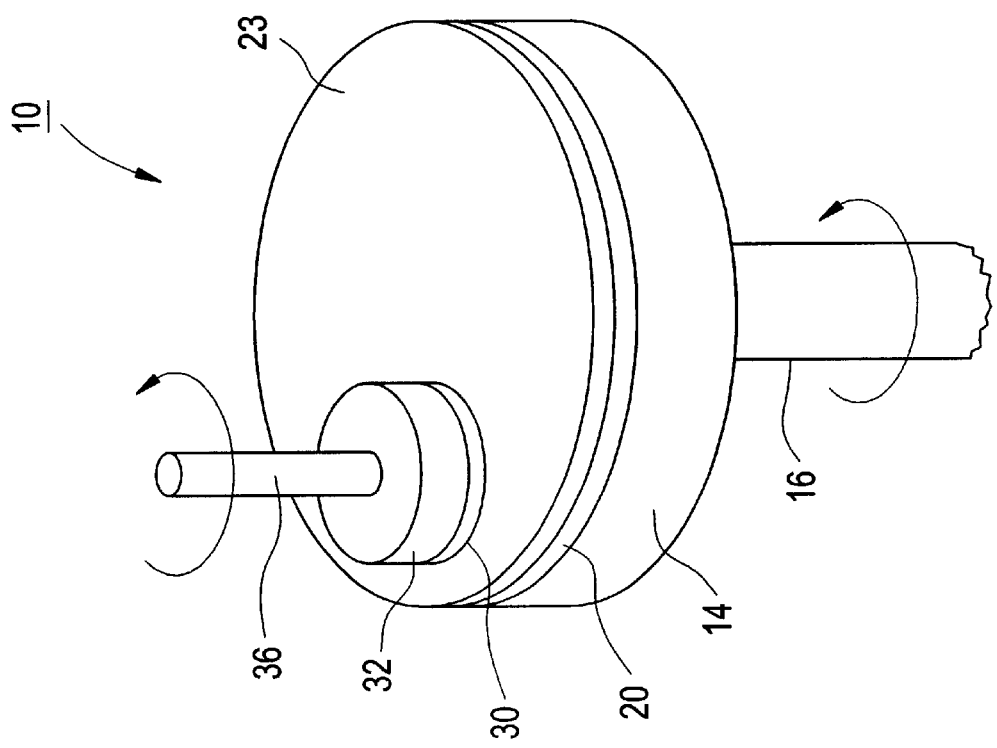
FIG. 1 is a schematic view of a related art CMP minipolisher.
Figure 2:
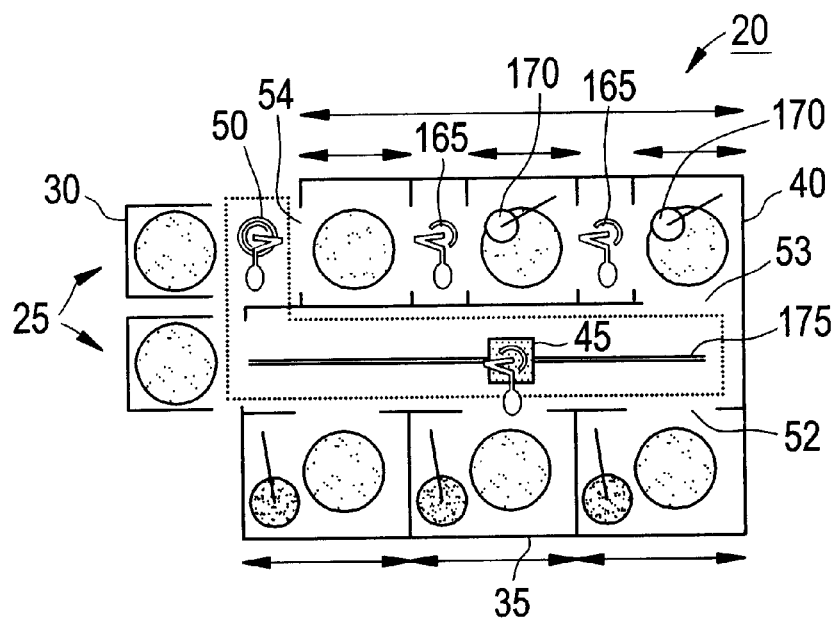
FIG. 2 is a schematic top-down view of a CMP system that is in accord with a first embodiment of the present invention.

A first embodiment CMP system according to the principles of the present invention is illustrated in FIG. 2. As shown, that first embodiment CMP system 20 includes a wafer load station 25 and a wafer unload station 30. The wafer load station 25 receives cut semiconductor wafers that have rough surfaces. Those cut semiconductor wafers are beneficially stacked in a wafer load cassette (described in more detail subsequently). The wafer unload station 30 receives polished and cleaned semiconductor wafers.

The CMP system 20 further includes a CMP polishing system 35 for polishing semiconductor wafers, and a cleaning system 40 for cleaning semiconductor wafers that were polished by the CMP polishing system 35. Furthermore, CMP system 20 includes a robotic system having a first robotic mover 45 and a second robotic mover 50. The first robotic mover 45 moves semiconductor wafers from the wafer load station 25 into the CMP polishing system 35, and from the CMP polishing system 35 into the cleaning system 40. Additionally, if the CMP polishing system 35 includes more than one mini-polisher (FIG. 2 shows three mini-polishers) the first robotic mover system might move semiconductor wafers from one mini-polisher to another. The second robotic mover 50 moves cleaned semiconductor wafers from the cleaning system into the wafer unload station 30.

In operation, a semiconductor wafer is transferred by the first robotic mover 45 from the wafer unload station into the CMP polishing system 35. If the CMP polishing system 35 includes more than one mini-polisher, the semiconductor wafers can be polished in a serial manner or in a parallel manner. In serial polishing a semiconductor wafer is polished in a first mini-polishing station, then that semiconductor wafer is sent to a second (and possibly subsequent) mini-polishing station for further polishing. In parallel polishing, semiconductor wafers are polished in different mini-polishing stations and then sent to the cleaning station 40.

In any event, semiconductor wafers enter and leave the CMP polishing system 35 through ports 52. Further, polished semiconductor wafers enter the cleaning system through ports 53 and leave through ports 54. More about this subsequently.

Figure 3:
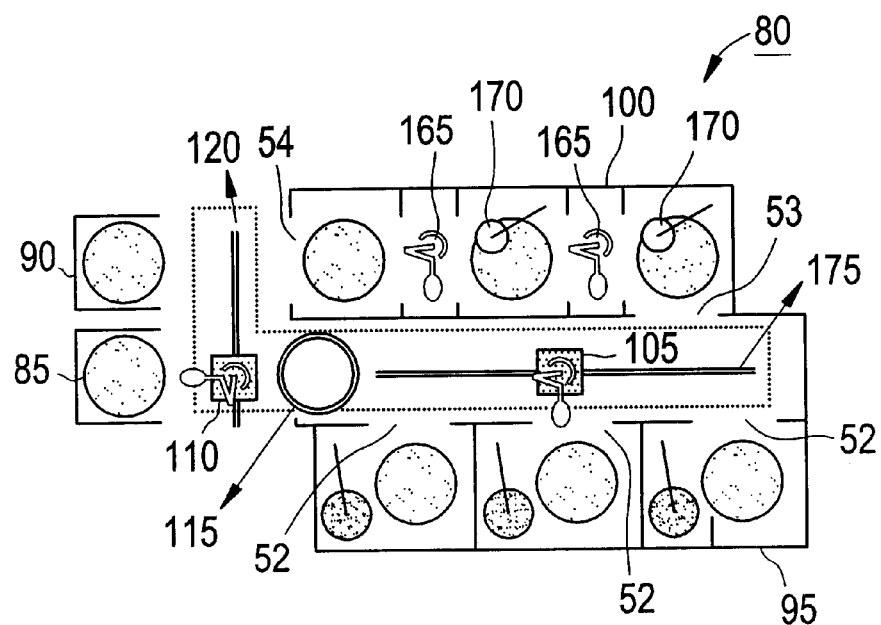
FIG. 3 is a schematic top-down view of a CMP system that is in accord with a second embodiment of the present invention.

A second embodiment CMP system 80, which is similar to the first embodiment CMP system 20, is shown in FIG. 3. The second embodiment CMP system 80 includes a wafer load station 85 and a wafer unload station 90. The wafer load station 85 receives cut semiconductor wafers, which are beneficially stacked in a wafer load cassette (described in more detail subsequently), while the wafer unload station 90 receives polished and cleaned semiconductor wafers. The second embodiment CMP system 80 further includes a CMP polishing system 95 and a cleaning system 100 for cleaning polished semiconductor wafers. Furthermore, the second embodiment CMP system 80 includes a robotic system having a first robotic mover 105 and a second robotic mover 110. Additionally, the second embodiment CMP system 80 further includes a buffer station 115.

In operation, the second robotic mover 110 moves semiconductor wafers from the wafer load station 85 onto the buffer station 115. The second robotic mover 110 also moves cleaned semiconductor wafers from the cleaning system 100 via port 54 into the wafer unload station 90. To accomplish this the second robotic mover 110 is mounted on a track 120, which beneficially runs parallel to the wafer load station 85 and to the wafer unload station 90. The first robotic mover 105 then moves semiconductor wafers from the buffer station 115 to the CMP polishing system 95 via ports 52, and from the CMP polishing system 95 to the cleaning system 100 via ports 52 and 53. Additionally, if the CMP polishing system 95 includes more than one mini-polisher, and if serial polishing is performed, the first robotic mover 105 moves semiconductor wafers from one mini-polisher to another.

Figure 4:
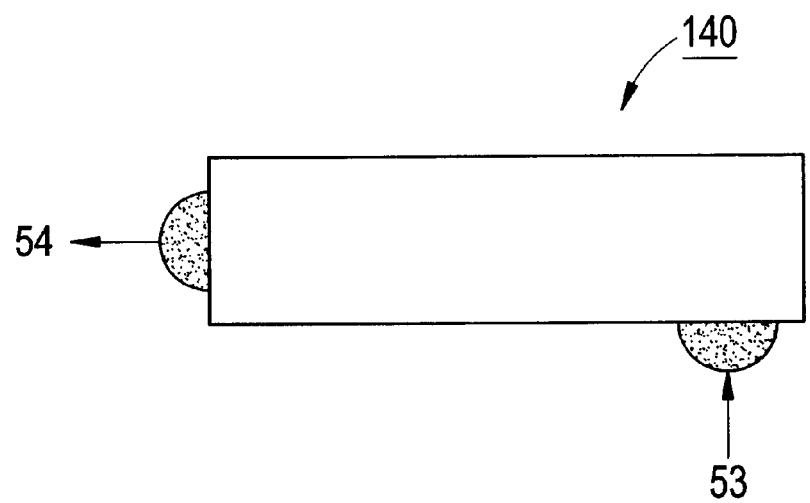
FIG. 4 is a schematic depiction of a basic cleaning system that is suitable for use in all of the illustrated embodiments of the present invention.

The first and second embodiment CMP systems 20 and 80, as well as all of the other CMP system embodiments that are subsequently described, beneficially include generic elements. For example, referring now to FIG. 4, each cleaning system (such as cleaning systems 40 and 100), are beneficially multi-station cleaning systems. A generic station is the multi-station cleaning system 140. Such systems include an entrance port 53 for receiving polished semiconductor wafers and an exit port 54 by which cleaned semiconductor wafers can be removed. Such a multi-station cleaning system 140 can include two, three, four, or more individual stations.

Figure 5:
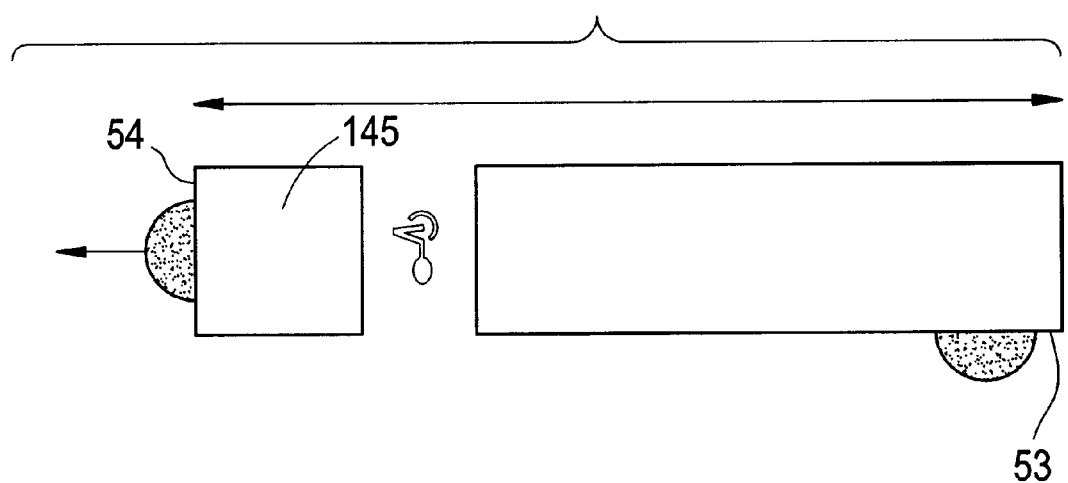
FIG. 5 is a schematic depiction of a cleaning system having a metrology station and that is suitable for use in all of the illustrated embodiments of the present invention.

Turning now to FIG. 5, in particular, whether specifically shown in any illustration, it should be understood that any multi-station cleaning system 140 can include a metrology station 145 for performing various mechanical and electrical tests on cleaned semiconductor wafers. Additionally, each multi-station cleaning system 140 includes a wafer transfer mechanisms 165, shown in FIGS. 2 and 3, for moving semiconductor wafers within the multi-station cleaning system 140. As will be subsequently illustrated and explained, a multi-station cleaning system 140 is protected by a housing to reduce contamination of the semiconductor wafers being cleaned (and measured). Additionally, as shown in FIGS. 2 and 3, each multi-station cleaning system beneficially includes cleaning brushes 170. Furthermore, while only top cleaning brushes are shown, it should be understood that brushes below the semiconductor wafers will often be employed. Furthermore, while brush type cleaning is beneficial, the principles of the present invention also encompass other cleaning systems, such as sonic (ultrasonic), rinse, and scrubber systems. Therefore, whether specifically described illustrated in a particular embodiment, each cleaning system should be understood has possibly including a metrology station, cleaning brushes, an entry port, an exit port, wafer transfer mechanisms, and a housing.

Figure 6:
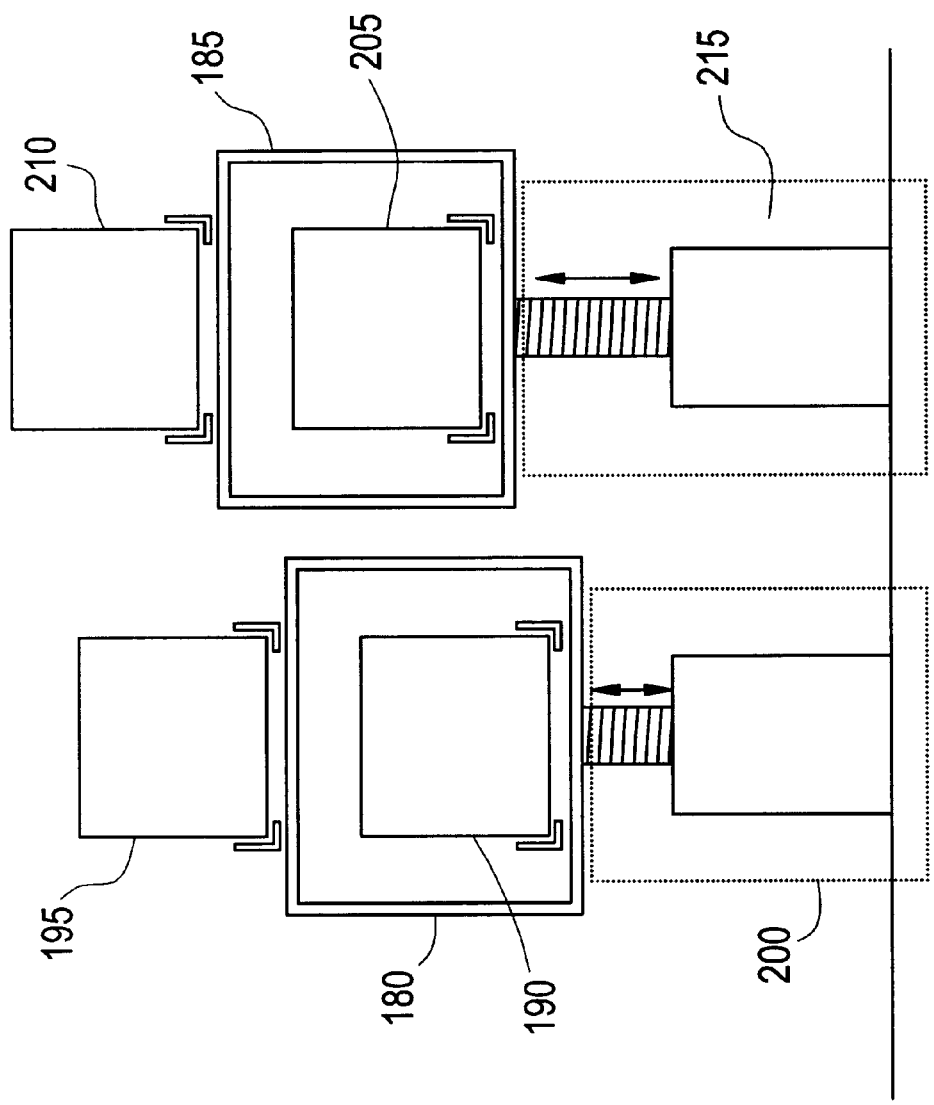
FIG. 6 is a schematic depiction of a wafer load station and a wafer unload station, both of which are capable of vertical motion to enable the use of multiple semiconductor wafer cassettes, and both of which are suitable for use in all of the illustrated embodiments of the present invention.

As another example of a generic element, referring now specifically to FIG. 6, each embodiment CMP system that has been or will be illustrated and described should be understood as including at least one wafer load station 180 (for example, wafer load stations 25 and 85) and a wafer unload station 185 (for example, wafer unload stations 30 and 90). The wafer load station 180 include a wafer load mechanism for receiving semiconductor wafers in a wafer load cassette 190. Furthermore, a wafer load station 180 can handle more than one wafer load cassette, reference wafer load cassette 195. In such cases, it is beneficial to include a motor driven vertical drive mechanism 200 to raise and low the wafer load cassettes 190 and 195 into position.

Still referring to FIG. 6, likewise, the wafer unload station 185 includes a wafer unload mechanism for receiving semiconductor wafers in a wafer unload cassette 205. Furthermore, the wafer unload station 185 can handle more than one wafer unload cassette, reference wafer unload cassette 210. In such cases, it is beneficial to include a motor driven vertical drive mechanism 215 to raise and low the wafer unload cassettes 205 and 210 into position. Thus, whether illustrated in a specific embodiment or not, each illustrated CMP systems should be understood as possibly including a wafer load station 180 and wafer unload station 185 according to FIG. 6.

As illustrated, the first and second embodiment CMP systems 20 and 80 have CMP polishing systems (35 and 95) and multi-station cleaning systems (40 and 100) that have linearly aligned stations. Furthermore, the CMP polishing systems (35 and 95) and the multi-station cleaning systems (40 and 100) are elongated, are adjacent, and extend parallel to one another. Furthermore, both CMP systems 20 and 80 have first robotic movers that run along tracks 175 that are between and parallel to the CMP polishing systems (35 and 95) and the multi-station cleaning systems (40 and 100). Such an arrangement is beneficial in that floor space is used fairly efficiently and such that all robotic movers can move semiconductors wafers in a single plane (no Z-axis motion is required, except for possibly in the wafer load and wafer unload stations).

Figure 7:
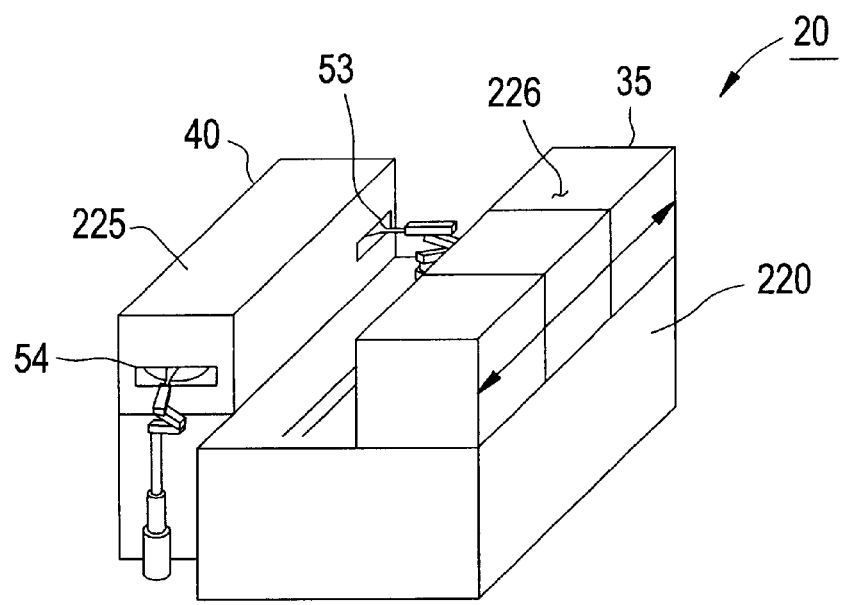
FIG. 7 is a schematic perspective view of a CMP system that is in accord with the first embodiment of the present invention, and which illustrates a contamination protection scheme that is generally applicable with all of the illustrated embodiments of the present invention.

As all of the illustrated CMP polishing systems are used to polish semiconductor wafers, cleanliness is crucial. Turning now to FIG. 7, which is a schematic perspective view of the first embodiment CMP system 20, that system is implemented on a platform 220 on which the CMP polishing system 35 sits. The multi-station cleaning system 40 is likewise raised from the ground. The multi-station cleaning system entrance 53 and the multi-station cleaning system exit 54 are shown. Furthermore, as shown, the multi-station cleaning system 40 is otherwise protected from contaminates by a housing 225. Additionally, the CMP polishing system 35 is protected by a housing 226. For convenience, the wafer load station 25 and the wafer unload station 30 are not shown. The housing 225 and 226 reduce contamination of the cleaned semiconductor wafers causes by the polishing process.

Figure 8:
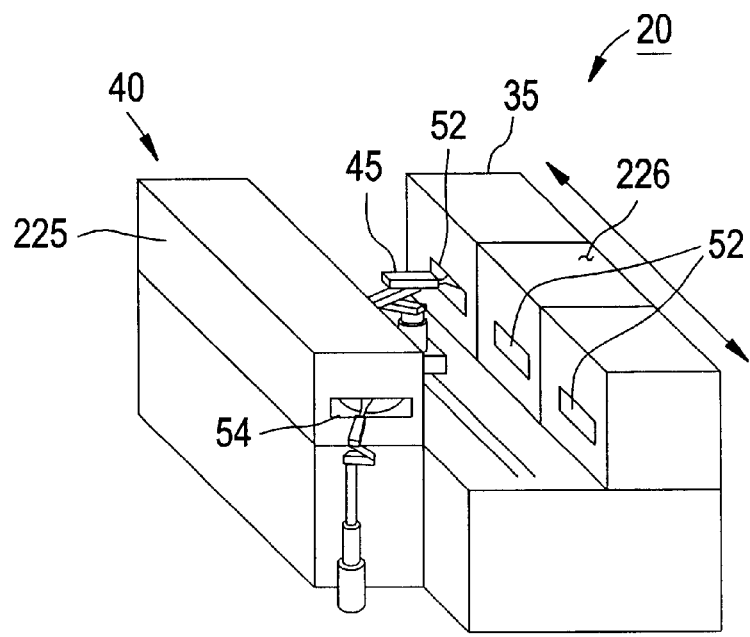
FIG. 8 is another schematic perspective view of a CMP system that is in accord with the first embodiment of the present invention, but from a different angle than FIG. 7.

Referring now to FIG. 8, which is a schematic perspective view of the first embodiment CMP systems 20 from another view, the CMP polishing system 35 includes at least one port 52. The first robotic mover 45 loads into and removes semiconductor wafers from the CMP polishing system 35 through ports 52.

It should be understood that all of the illustrated embodiments, whether previously or subsequently described, beneficially implement a similar housing scheme to reduce contamination. Furthermore, it should be understood that the ports shown in the various figures determine where semiconductor wafers enter and/or exit the various workstations.

Turn now to FIG. 9 for a schematic top-down view of a third embodiment CMP system 295 that is in accord with the principles of the present invention. The third embodiment CMP system includes an elongated, multi-station CMP polishing system 300 for polishing semiconductor wafers. That system is linearly aligned with an elongated, multi-station cleaning system 305 for cleaning semiconductor wafers that were polished by the CMP polishing system 300. The third embodiment CMP system 295 includes a robotic system comprised of a first robotic mover 310 and a second robotic mover 315.

The first robotic mover 310 moves semiconductor wafers from a wafer load station 320 into the multi-station CMP polishing system 300, and from the multi-station CMP polishing system 300 into the multi-station cleaning system 305. Semiconductor wafer flow using the first robotic mover 310 is via the ports 52 and 53. Additionally, if serial polishing is implemented, the first robotic mover 310 moves semiconductor wafers from one mini-polisher station 311 of the multi-station CMP polishing system 300 to another mini-polisher station 312 (and possibly to a mini-polisher station 313).

The second robotic mover 315 moves cleaned semiconductor wafers from the multi-station cleaning system 305 into a wafer unload station 325 through port 54. As shown in FIG. 9, the wafer load station 320 and the wafer unload station 325 are adjacent, and the second robotic mover 315 is linearly aligned with the multi-station cleaning system 305. As shown, the first robotic mover 310 moves on a track 327 that runs along the full length of the multi-station cleaning system 305.

Turn now to FIG. 10 for a schematic top-down view of a fourth embodiment CMP system 350 that is in accord with the principles of the present invention. The fourth embodiment CMP system 350 is a modification of the third embodiment CMP system 295. The CMP system 350 includes an elongated, multi-station CMP polishing system 355 for polishing semiconductor wafers, which is linearly aligned with an elongated multi-station cleaning system 360 for cleaning semiconductor wafers that were polished by the CMP polishing system 355. The fourth embodiment CMP system 350 also includes a robotic system having a first robotic mover 365 and a second robotic mover 370.

The first robotic mover 365 moves semiconductor wafers from a wafer load station 375 into the multi-station CMP polishing system 355, and from the multi-station CMP polishing system 355 into the multi-station cleaning system 360. Access to the multi-station CMP polishing system 355 is through ports 52, while access to the multi-station cleaning system 360 is through port 53. If serial polishing is implemented, the first robotic mover 365 moves semiconductor wafers from one mini-polisher station 376 of the multi-station CMP polishing system 355 to another mini-polisher station 377 (and possibly to a mini-polisher station 378). The second robotic mover 370 moves cleaned semiconductor wafers from the multi-station cleaning system 360 via port 54 into a wafer unload station 380.

As shown in FIG. 10, the second robotic mover 370 is linearly aligned with the multi-station cleaning system 360. Further, the first robotic mover 365 moves on a short track 382 that does not run along the full length of the multi-station cleaning system 360. Additionally, the wafer load station 375 is mounted on a track 383 that enables the wafer load station 375 to move from a position adjacent the wafer unload station 380 to the end of the short track 382. This configuration reduces the length of travel of the first robotic mover 365 when compared to the third embodiment.

Turn now to FIG. 11 for a schematic top-down view of a fifth embodiment CMP system 400 that is in accord with the principles of the present invention. The fifth embodiment CMP system 400 includes parallel CMP polishing subsystems, each of which a similar to the CMP system 295 illustrated in FIG. 9. As shown in FIG. 11, the fifth embodiment CMP system 400 includes a first subsystem comprised of a first elongated, multi-station CMP polishing system 405 and a linearly aligned and elongated first multi-station cleaning system 410. The CMP system 400 further includes a second subsystem comprised of a second elongated, multi-station CMP polishing system 415 and a linearly aligned and elongated second multi-station cleaning system 420. Beneficially, the first and second subsystems are aligned in parallel.

The CMP system 400 also includes a robotic system comprised of a first robotic mover 425, a second robotic mover 430, and a third robotic mover 435. The first robotic mover 425 moves semiconductor wafers from a wafer load station 440 into the first multi-station CMP polishing system 405 and into the second multi-station CMP polishing system 415. Furthermore, the first robotic mover 425 moves polished semiconductor wafers from the first multi-station CMP polishing system 405 and the second multi-station CMP polishing system 415 into the first multi-station cleaning system 410 and into the second multi-station cleaning system 420. Additionally, if serial polishing is implemented, the first robotic mover 425 moves semiconductor wafers between mini-polisher stations within the first multi-station CMP polishing system 405 and the second multi-station CMP polishing system 415. It should be understood that the first robotic mover 425 can be used to move semiconductor wafers only within an individual sub-system or between the sub-systems. Furthermore, access to the CMP polishing systems is via ports 52, while access to the multi-station cleaning systems is via ports 53.

The second robotic mover 430 moves cleaned semiconductor wafers from the first multi-station cleaning system 410 via a port 54 into a first wafer unload station 427, while the third robotic mover 435 moves cleaned semiconductor wafers from the second multi-station cleaning system 420 via a port 54 into a second wafer unload station 428. As shown in FIG. 11, the second robotic mover 370 is linearly aligned with the first multi-station cleaning system 410 and the third robotic mover 435 is linearly aligned with the second multi-station cleaning system 420.

Still referring to FIG. 11, the first robotic mover 425 moves on a long track 442 that runs along the full length of the first and second multi-station cleaning systems and between the first and second sub-systems. The wafer load station 440 is aligned with the track 442.

Figure 12:
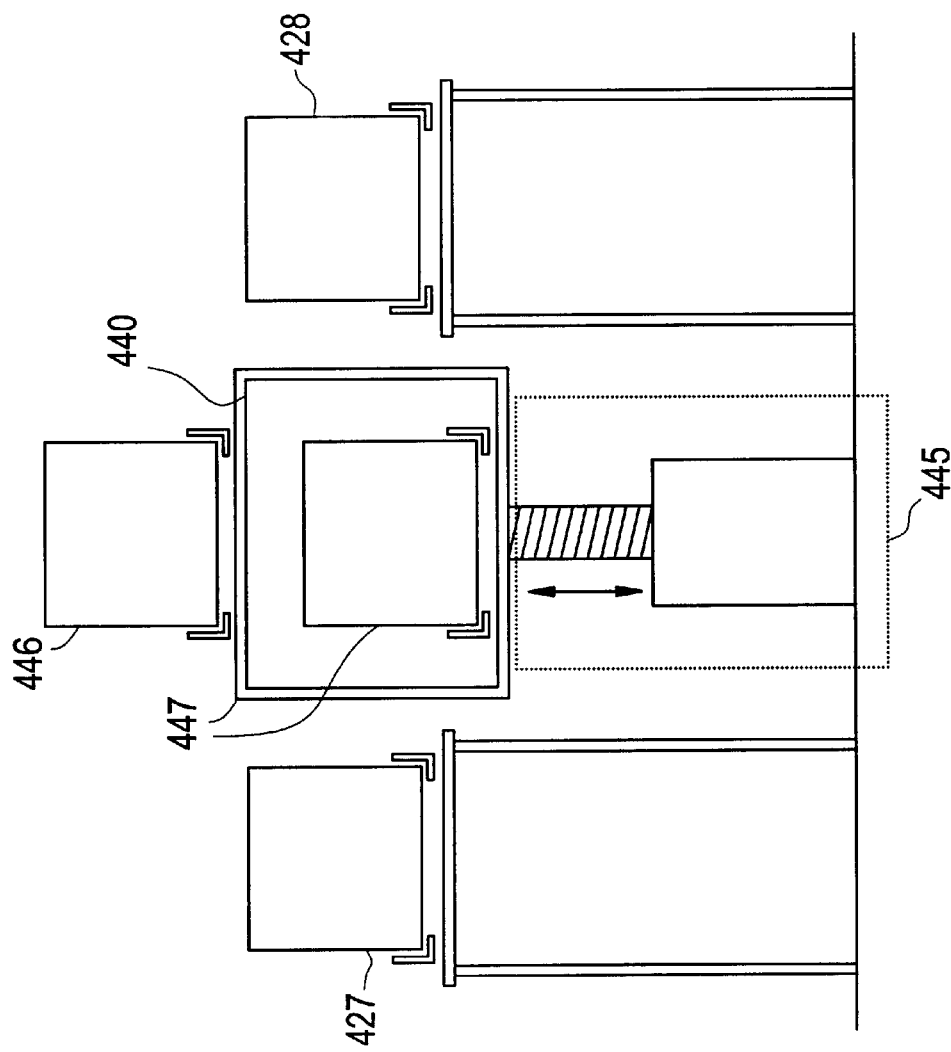
FIG. 12 is a schematic depiction of fixed wafer unload stations and a vertically movable wafer load station that is capable of use with multiple semiconductor wafer cassettes.

FIG. 12 illustrates a side view of the wafer load station 440, the first wafer unload station 427, and the second wafer unload station 428. As shown, because the wafer load station 440 feeds semiconductor wafers that are eventually unloaded into two unload stations, the wafer load station beneficially has twice the capacity of the wafer unload stations. This can be achieved using a motor driven vertical lift mechanism 445 (as previously described) that moves cassettes 446 and 447 into proper locations.

A variation of the fifth embodiment CMP system 400 is a sixth embodiment CMP system 450 that is shown in FIG. 13. The CMP system 400 also includes parallel CMP polishing sub-systems, each of which is somewhat similar to those shown in FIG. 11. As shown in FIG. 13, the CMP system 450 includes a first subsystem comprised of a first elongated, multi-station CMP polishing system 455 and a linearly aligned and elongated first multi-station cleaning system 460. The CMP polishing system 450 further includes a second subsystem comprised of a second elongated, multi-station CMP polishing system 465 and a linearly aligned and elongated second multi-station cleaning system 470. Beneficially, the first and second subsystems are aligned in parallel.

The CMP system 450 also includes a robotic system, which is comprised of a first robotic mover 475 and a second robotic mover 480, and a buffer station 485. The first robotic mover 475 moves semiconductor wafers from a wafer load station 490 into the buffer station 485. The first robotic mover 475 also moves cleaned semiconductor wafers via ports 54 from the first multi-station cleaning system 460 into a first wafer unload station 492 and from the second multi-station cleaning system 470 into a second wafer unload station 493. As shown in FIG. 13, the first robotic mover 475 is mounted on a track 494 that runs along the linearly aligned wafer load station 490, first wafer unload station 492, and second wafer unload station 493.

Still referring to FIG. 13, the second robotic mover 480 moves semiconductor wafers from the buffer station 485 into the first multi-station CMP polishing system 455 and into the second multi-station CMP polishing system 465 via ports 52. The second robotic mover 480 also moves polished semiconductor wafers from the first multi-station CMP polishing system 455 and the second multi-station CMP polishing system 465, through ports 52, into the first multi-station cleaning system 460 and into the second multi-station cleaning system 470 via ports 53. Additionally, if serial polishing is implemented, the second robotic mover 480 moves semiconductor wafers between mini-polisher stations within the first multi-station CMP polishing system 455 and the second multi-station CMP polishing system 465. It should be understood that the second robotic mover 480 can be used to move semiconductor wafers within the individual sub-systems or between sub-systems. Furthermore, to accomplish its tasks, the second robotic mover 480 is mounted on a long track 495 that extends from the buffer station 485 and runs between the first and second sub-systems.

Figure 14:
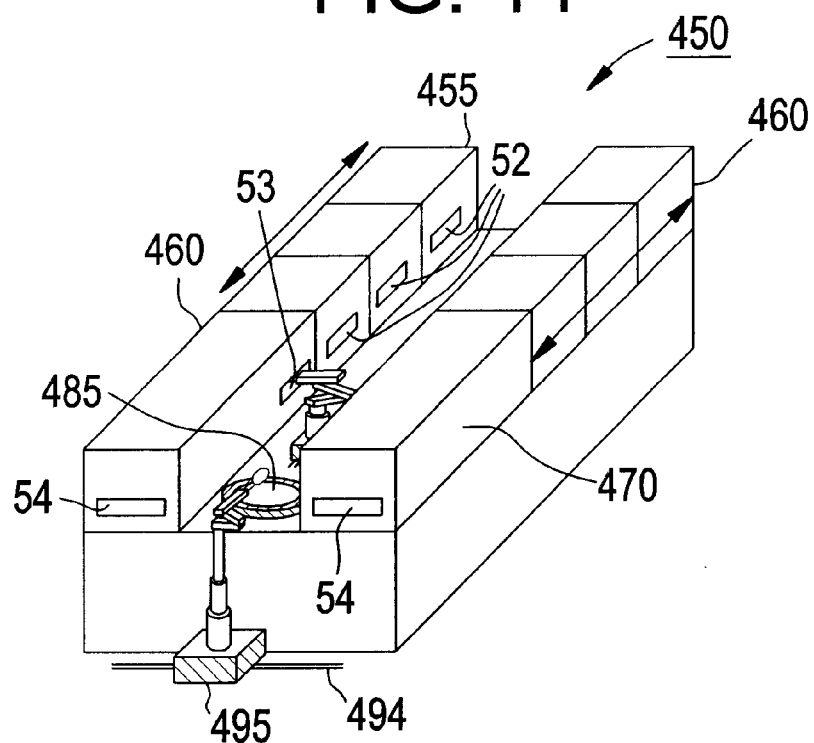
FIG. 14 is a schematic perspective view of a CMP system that is in accord with the sixth embodiment of the present invention, and which generally illustrates a contamination protection scheme and a robotic movement scheme that are generally applicable with the principles of the present invention.

FIG. 14 illustrates a perspective view of the sixth embodiment CMP system 450, without the wafer load station 490, the first wafer unload station 492, and the second wafer unload station 493. The buffer station 485 is positioned to receive semiconductor wafers from the first robotic mover 495, and the first and second subsystems are enclosed with housings to reduce contamination. The ports 52, 53, and 54 control the entry and exit points of the various sub-systems.

The foregoing has described CMP systems that are suitable for polishing and cleaning semiconductor wafers using a planar flow. That is, except possibly for the wafer load and unload stations, all of the system's stations and sub-systems can operate with semiconductor wafers in one plane. While this is a beneficial arrangement in that relatively simple robot movers can be used, in practice planar flow is not always optimal. In particular, planar flow CMP systems do not necessarily have the smallest footprint.

Figure 15:
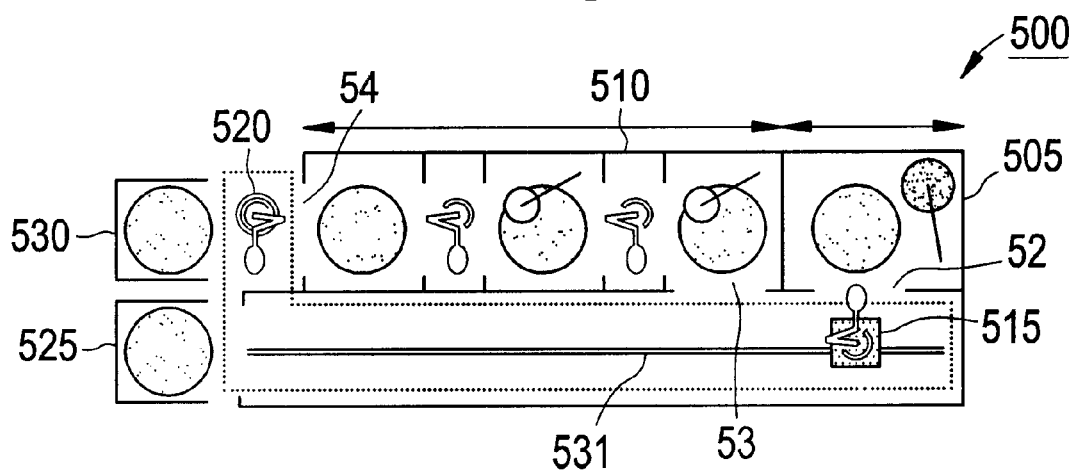
FIG. 15 is a schematic top-down view of a CMP system that is in accord with a seventh embodiment of the present invention.

However, the principles of the present invention provide for other than planar semiconductor wafer flow. For example, FIG. 15 illustrates a seventh embodiment CMP system 500 that is in accord with the principles of the present invention. The CMP system 500 includes a multi-station CMP polishing system 505 and an elongated multi-station cleaning system 510.

Figure 16:
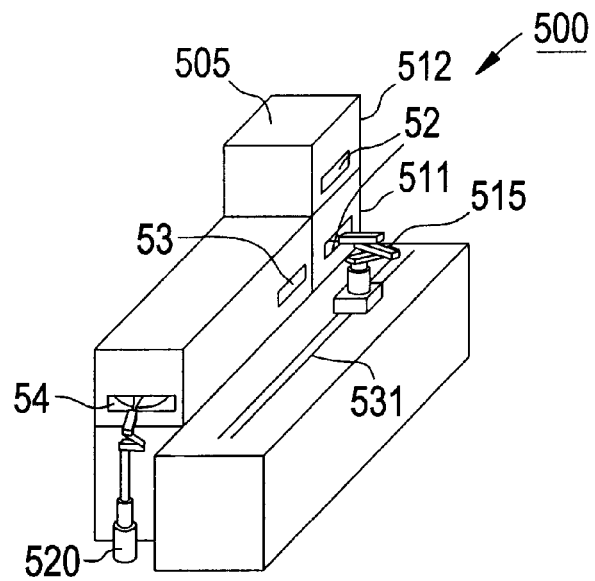
FIG. 16 is a schematic perspective view of a CMP system that is in accord with the seventh embodiment of the present invention, and which illustrates a vertically stacked CMP polishing station, a contamination protection scheme, and a robotic movement scheme that are generally applicable with the principles of the present invention.

Referring now to FIG. 16, the multi-station CMP polishing system 505 is comprised of a lower mini-polishing station 511 and a stacked upper mini-polishing station 512.

Referring now to both FIGS. 15 and 16, the CMP system 500 also includes a robotic system comprised of a first robotic mover 515 and a second robotic mover 520. The first robotic mover 515 moves semiconductor wafers from a wafer load station 525 into the multi-station CMP polishing system 505. The first robotic mover 515 has Z-axis movement capability to enable a semiconductor wafer to selectively placed into, or moved between, the lower mini-polishing station 511 and the upper mini-polishing station 512. The first robotic mover 515 also moves polished semiconductor wafers from the multi-station CMP polishing system 505 into the multi-station cleaning system 510. Again, access to the CMP polishing system 505 is via ports 52, while entry of semiconductor wafers to the multi-station cleaning system 510 is via a port 53.

Referring now to FIG. 15, the second robotic mover 520 moves cleaned semiconductor wafers from the multi-station cleaning system 510 into a wafer unload station 530 via a port 54. As shown, the second robotic mover 520 is linearly aligned with the multi-station cleaning system 510 and with the CMP polishing system 505.

Figure 17:
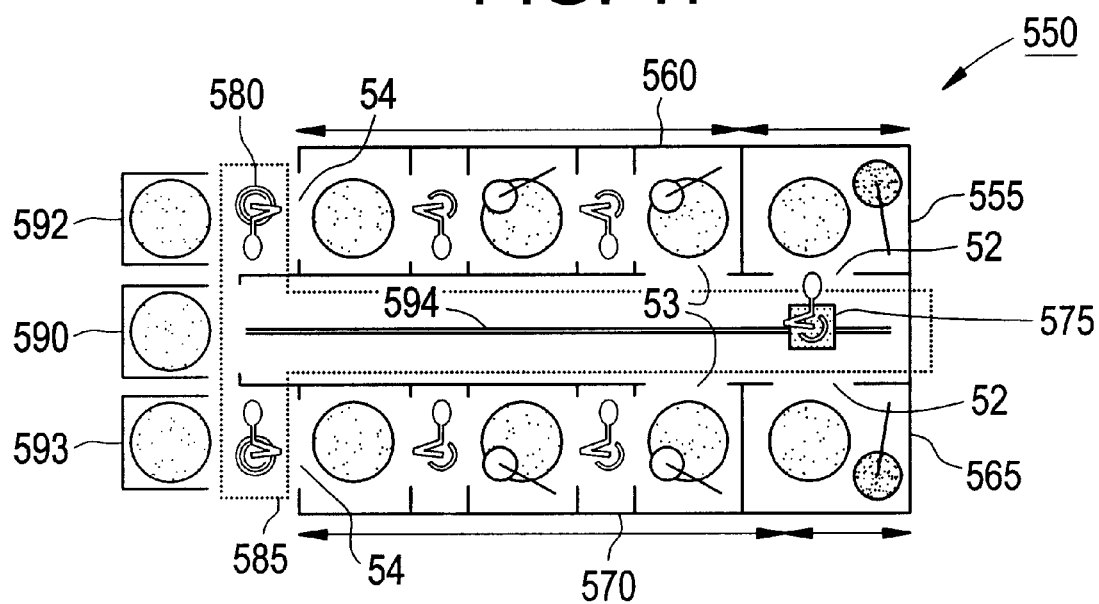
FIG. 17 is a schematic top-down view of a CMP system that is in accord with an eighth embodiment of the present invention.

Non-planar flow CMP systems can also be paralleled. For example, FIG. 17 illustrates an eighth embodiment CMP system 550 that is in accord with the principles of the present invention. The CMP system 550 includes parallel non-planar flow CMP polishing sub-systems, each of which is similar to the CMP system illustrated in FIGS. 15 and 16. As shown in FIG. 17, the CMP polishing system 550 includes a first subsystem comprised of a first stacked multi-station CMP polishing system 555 and a first linearly aligned and elongated first multi-station cleaning system 560. The CMP polishing system 400 further includes a second subsystem comprised of a second stacked multi-station CMP polishing system 565 and a linearly aligned and elongated second multi-station cleaning system 570. Beneficially, the first and second subsystems are aligned in parallel.

The CMP system 550 also includes a robotic system comprised of a first robotic mover 575, a second robotic mover 580, and a third robotic mover 585. The first robotic mover 575 moves semiconductor wafers from a wafer load station 590 into the first stacked multi-station CMP polishing system 555 and into the second stacked multi-station CMP polishing system 565 via ports 52. The first robotic mover 575 also moves polished semiconductor wafers from the first stacked multi-station CMP polishing system 555 and the second stacked multi-station CMP polishing system 565 (via ports 52) into the first multi-station cleaning system 560 and into the second multi-station cleaning system 570 via ports 53. Additionally, if serial polishing is implemented, the first robotic mover 575 moves semiconductor wafers between mini-polisher stations within the first stacked multi-station CMP polishing system 555 and the second stacked multi-station CMP polishing system 565.

The second robotic mover 580 moves, via a port 54, cleaned semiconductor wafers from the first multi-station cleaning system 560 into a first wafer unload station 592, while the third robotic mover 585 moves, via a port 54, cleaned semiconductor wafers from the second multi-station cleaning system 570 into a second wafer unload station 593. As shown in FIG. 17, the second robotic mover 580 is linearly aligned with the first multi-station cleaning system 560 while the third robotic mover 585 is linearly aligned with the second multi-station cleaning system 570.

The first robotic mover 575, which is capable of Z-axis motion, moves on a long track 594 that runs along and between the first and second subsystems systems. The wafer load station 590 is aligned with the track 594.

Figure 18:
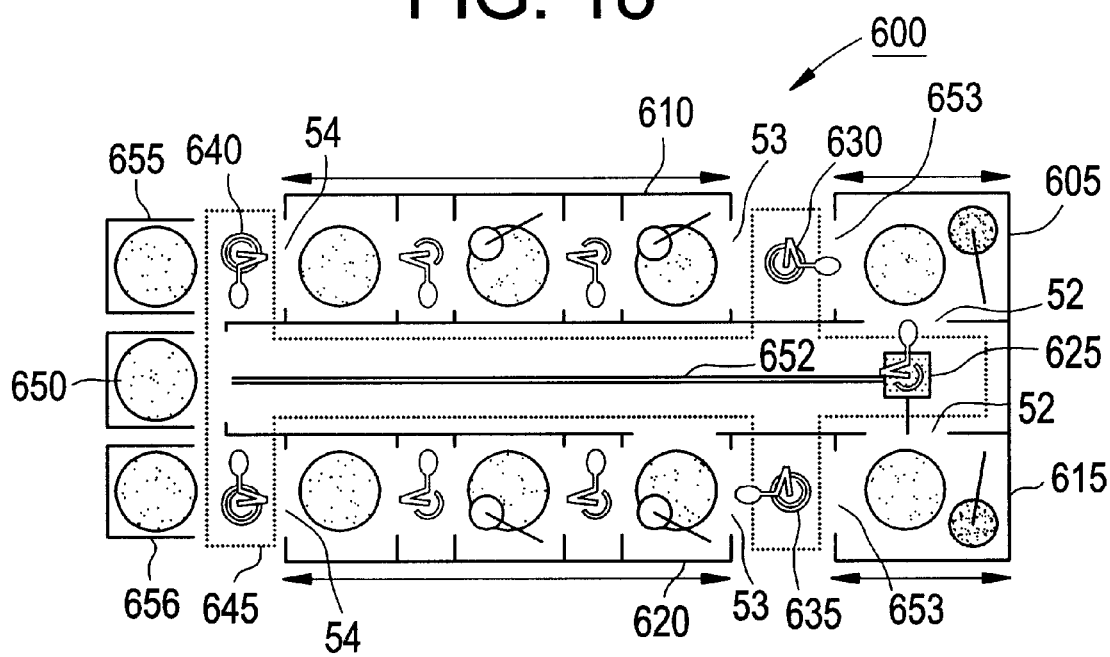
FIG. 18 is a schematic top-down view of a CMP system that is in accord with a ninth embodiment of the present invention.
Figure 19:
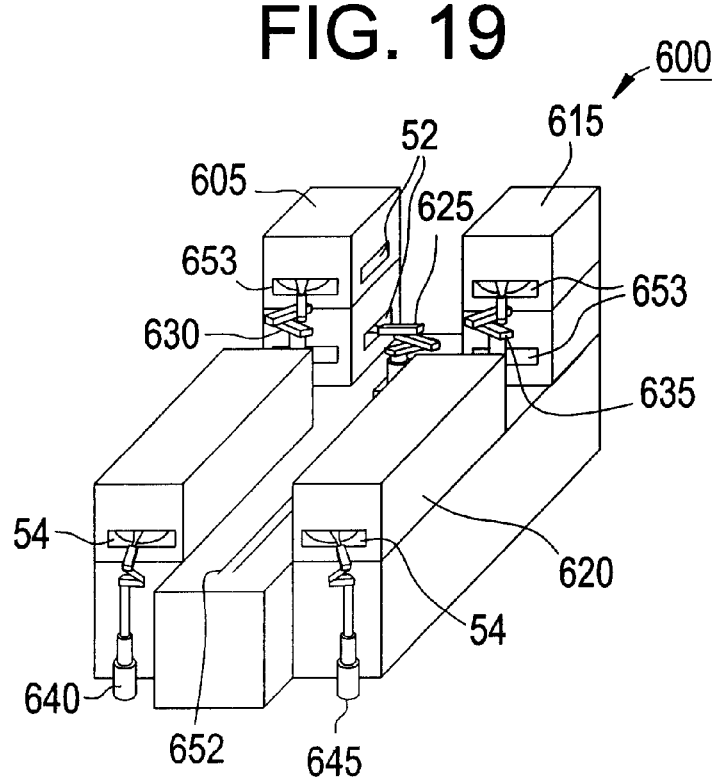
FIG. 19 is a schematic perspective view of a CMP system that is in accord with the ninth embodiment of the present invention, and which illustrates vertical stacked CMP polishing stations, a contamination protection scheme, and a robotic movement scheme that are generally applicable with the principles of the present invention.

Another non-planar flow CMP system is the ninth embodiment CMP system 600 shown in FIG. 18. The CMP system 600 includes parallel non-planar flow CMP polishing sub-systems. As shown in FIG. 18, the CMP polishing system 600 includes a first subsystem comprised of a first stacked multi-station CMP polishing system 605 and a linearly aligned and elongated first multi-station cleaning system 610. The CMP polishing system 600 further includes a second subsystem comprised of a second stacked multi-station CMP polishing system 615 and a linearly aligned and elongated second multi-station cleaning system 620. Beneficially, the first and second subsystems are aligned in parallel.

The CMP system 600 also includes a robotic system comprised of a first robotic mover 625, a second robotic mover 630, a third robotic mover 635, a fourth robotic mover 640, and a fifth robotic mover 645. The first robotic mover 625 moves semiconductor wafers from a wafer load station 650 into the first stacked multi-station CMP polishing system 605 and into the second stacked multi-station CMP polishing system 615 via ports 52. The first robotic mover 625, which is capable of Z-axis motion, moves on a long track 652 that runs along and between the first and second sub-systems. Beneficially, the wafer load station 650 is aligned with the track 652.

The second robotic mover 630 moves polished semiconductor wafers from the first stacked multi-station CMP polishing system 605, via a side port 653, into the first multi-station cleaning system 610 via a port 53. The third robotic mover 635 moves polished semiconductor wafers from the second stacked multi-station CMP polishing system 615, via a side port 653, into the second multi-station cleaning system 620 via a port 53. This, the first and second stacked multi-station CMP polishing systems include special side ports 653. These ports free up the first robotic mover 625 from having to transport semiconductor wafers into the multi-station cleaning systems.

The fourth robotic mover 640 moves cleaned semiconductor wafers from the first multi-station cleaning system 610 into a first wafer unload station 655, while the fifth robotic mover 645 moves cleaned semiconductor wafers from the second multi-station cleaning system 620 into a second wafer unload station 656.

As shown in FIG. 18, the second and fourth robotic movers 630 and 640 are beneficially linearly aligned with the first multi-station cleaning system 610, while the third and fifth robotic movers 635 and 645 are beneficially linearly aligned with the second multi-station cleaning system 620.

19 shows a perspective view of the CMP system 600. The first and second subsystems are internally linearly aligned and housed to reduce contamination. Furthermore, the first, second and third robotic movers are capable of Z-axis motion.

Figure 20:
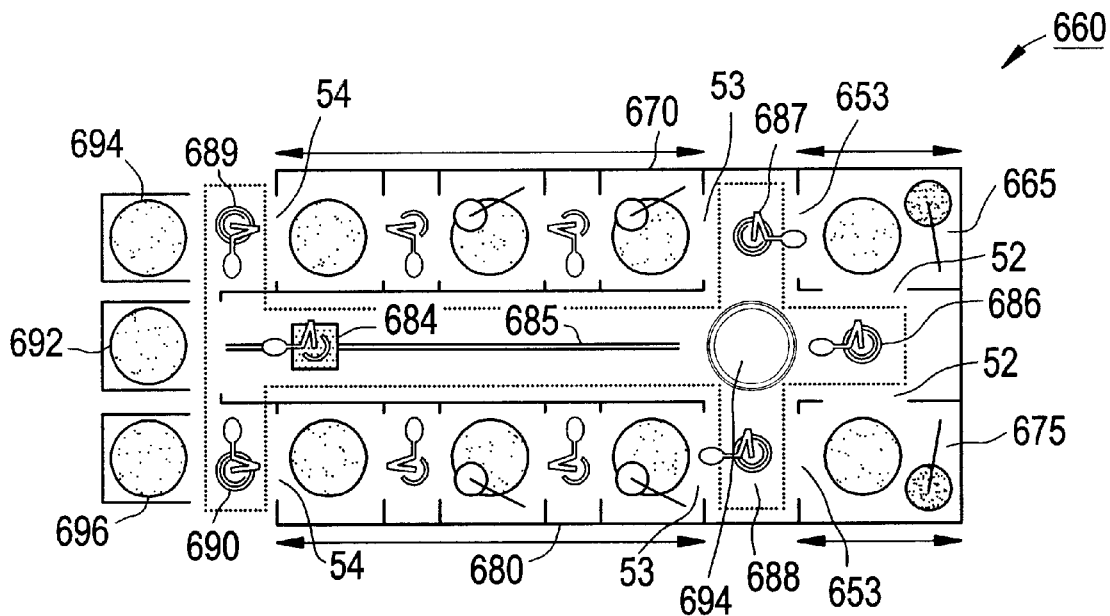
FIG. 20 is a schematic top-down view of a CMP system that is in accord with a tenth embodiment of the present invention.

Yet another non-planar flow CMP system is the tenth embodiment CMP system 660 shown in FIG. 20. The CMP system 660 includes parallel non-planar flow CMP polishing sub-systems. As shown in FIG. 20, the CMP system 660 includes a first subsystem comprised of a first stacked multi-station CMP polishing system 665 and a linearly aligned and elongated first multi-station cleaning system 670. The CMP system 660 further includes a second subsystem comprised of a second stacked multi-station CMP polishing system 675 and a linearly aligned and elongated second multi-station cleaning system 680. Beneficially, the first and second subsystems are aligned in parallel.

The CMP system 660 also includes a robotic system comprised of a first robotic mover 684 (on a track 685), a second robotic mover 686, a third robotic mover 687, a fourth robotic mover 688, a fifth robotic mover 689, and a sixth robotic mover 690. The first robotic mover 684 moves semiconductor wafers from a wafer load station 692, along the track 685, and into a buffer station 694. Beneficially, the wafer load station 692 is aligned with the track 685.

The second robotic mover 686 moves semiconductor wafers from the buffer station 694 selectively into the first stacked multi-station CMP polishing system 665 and into the second stacked multi-station CMP polishing system 675 via ports 52. The second robotic mover 625 is capable of Z-axis motion.

The third robotic mover 687 moves polished semiconductor wafers from the first stacked multi-station CMP polishing system 665, via a side port 653, into the first multi-station cleaning system 670 via a port 53. The fourth robotic mover 688 moves polished semiconductor wafers from the second stacked multi-station CMP polishing system 675, via a side port 653, into the second multi-station cleaning system 680 via a port 53. The third and fourth robotic movers 687 and 688 are capable of Z-axis motion.

The fifth robotic mover 689 moves cleaned semiconductor wafers from the first multi-station cleaning system 670 via port 54 into a first wafer unload station 694, while the sixth robotic mover 690 moves cleaned semiconductor wafers from the second multi-station cleaning system 680 via port 54 into a second wafer unload station 696. As shown in FIG. 20, the third and fifth robotic movers 687 and 689 are beneficially linearly aligned with the first multi-station cleaning system 670, while the fourth and sixth robotic movers 688 and 690 are beneficially linearly aligned with the second multi-station cleaning system 680.

Figure 21:
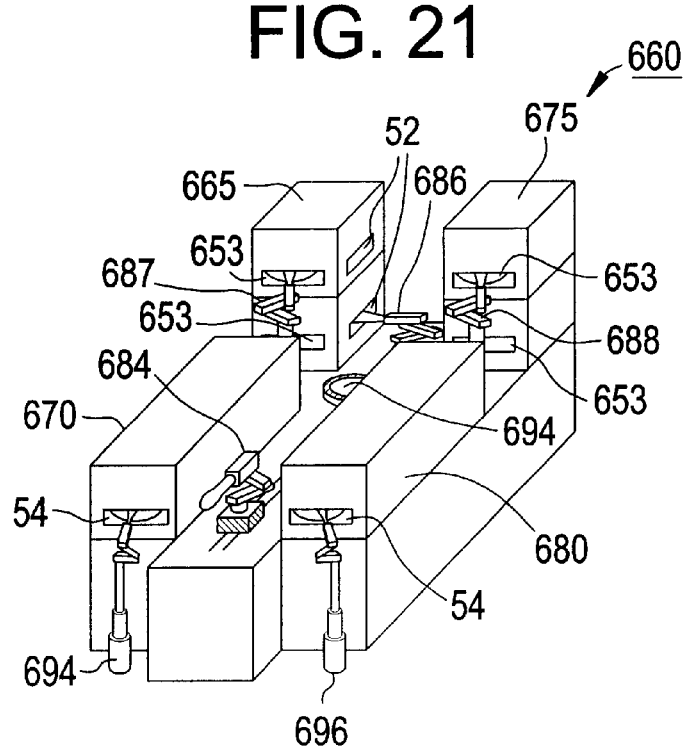
FIG. 21 is a schematic perspective view of a CMP system that is in accord with the tenth embodiment of the present invention, and which illustrates vertical stacked CMP polishing stations, a contamination protection scheme, a robotic movement scheme, and a buffer station that are all generally applicable with the principles of the present invention.

FIG. 21 shows a perspective view of the CMP system 660. As shown, the second, third and fourth robotic movers 686, 687, and 688, respectively are capable of Z-axis motion, and the CMP system 660 is housed to reduce contamination.

Figure 22:
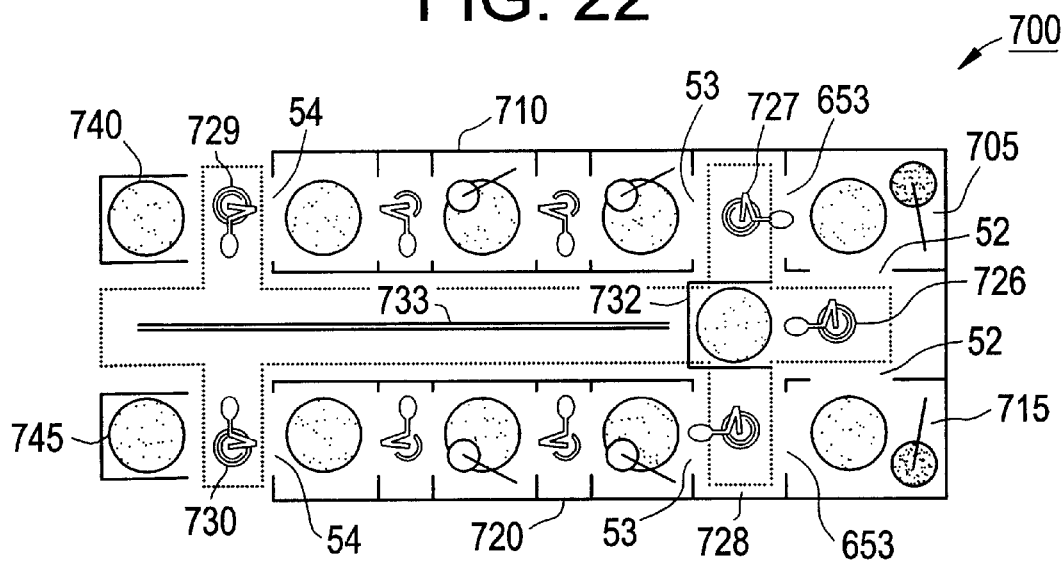
FIG. 22 is a schematic top-down view of a CMP system that is in accord with an eleventh embodiment of the present invention.

An alternative to the tenth embodiment CMP system 660 is the eleventh embodiment CMP system 700 shown in FIG. 22. The CMP system 700 includes a first subsystem comprised of a first stacked multi-station CMP polishing system 705 and a linearly aligned and elongated first multi-station cleaning system 710. The CMP system 700 further includes a second subsystem comprised of a second stacked multi-station CMP polishing system 715 and a linearly aligned and elongated second multi-station cleaning system 720. Beneficially, the first and second subsystems are aligned in parallel.

The CMP system 700 also includes a robotic system comprised of a first robotic mover 726, a second robotic mover 727, a third robotic mover 728, a fourth robotic mover 729, and a fifth robotic mover 730. The first robotic mover 684 moves semiconductor wafers from a wafer load station 732, which in on a track 733, selectively into the first stacked multi-station CMP polishing system 705 and into the second stacked multi-station CMP polishing system 715 via ports 52. The first robotic mover 726 is capable of Z-axis motion.

The second robotic mover 727 moves polished semiconductor wafers from the first stacked multi-station CMP polishing system 705, via side ports 653, into the first multi-station cleaning system 710 via a port 53. The third robotic mover 728 moves polished semiconductor wafers from the second stacked multi-station CMP polishing system 715, via side ports 653, into the second multi-station cleaning system 720 via a port 53. The fourth robotic mover 729 moves cleaned semiconductor wafers from the first multi-station cleaning system 710 via a port 54 into a first wafer unload station 740, while the fifth robotic mover 730 moves cleaned semiconductor wafers from the second multi-station cleaning system 720 via a port 54 into a second wafer unload station 745. As shown in FIG. 22, the second and fourth robotic movers 727 and 729 are beneficially linearly aligned with the first multi-station cleaning system 710, while the third and fifth robotic movers 728 and 730 are beneficially linearly aligned with the second multi-station cleaning system 720. Furthermore, the first, second, and third robotic movers 726, 727, and 728 are capable of Z-axis motion.

Figure 23:
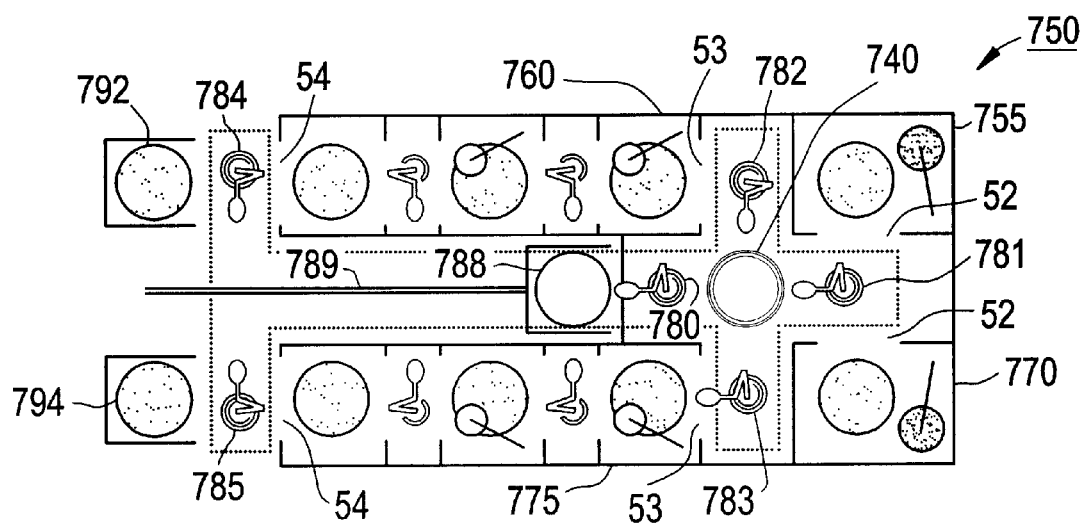
FIG. 23 is a schematic top-down view of a CMP system that is in accord with a twelfth embodiment of the present invention.

For maximum throughput with any given footprint it is often beneficial to utilize non-planar flow. However, contamination always remains a problem. Thus it is often preferred to reduce the number of ports within a CMP system. Furthermore, it is beneficial to be able to rapidly move semiconductor wafers within a CMP system. FIG. 23 illustrates a twelfth embodiment CMP system 750 that makes good use of floor space (has a small footprint) with a reduced number of ports. As shown, the CMP system 750 includes a first subsystem comprised of a first stacked multi-station CMP polishing system 755 and a linearly aligned and elongated first multi-station cleaning system 760. The CMP system 750 further includes a second subsystem comprised of a second stacked multi-station CMP polishing system 770 and a linearly aligned and elongated second multi-station cleaning system 775. Beneficially, the first and second subsystems are aligned in parallel.

The CMP system 750 also includes a robotic system comprised of a first robotic mover 780, a second robotic mover 781, a third robotic mover 782, a fourth robotic mover 783, a fifth robotic mover 784, and a sixth robotic mover 785. The first robotic mover 780 moves semiconductor wafers from a wafer load station 788, which in on a track 789, into a buffer station 790. The second robotic mover 781 removes semiconductor wafers from the buffer station 790 and selectively sends them to the first stacked multi-station CMP polishing system 755 and to the second stacked multi-station CMP polishing system 770 via ports 52. The second robotic mover 781 also removes semiconductor wafers from first stacked multi-station CMP polishing system 755 and from the second stacked multi-station CMP polishing system 770, via ports 52, and sends the semiconductor wafers back to the buffer station 790. The second robotic mover 781 is capable of Z-axis motion.

The third robotic mover 782 moves polished semiconductor wafers from the buffer station 790 an inserts them into the first multi-station cleaning system 760 via a port 53. The fourth robotic mover 728 moves polished semiconductor wafers from the buffer station 790 and inserts them into the second multi-station cleaning system 775 via a port 53. The fifth robotic mover 784 moves cleaned semiconductor wafers from the first multi-station cleaning system 760 via a port 54 into a first wafer unload station 792, while the sixth robotic mover 785 moves cleaned semiconductor wafers from the second multi-station cleaning system 775 via a port 54 into a second wafer unload station 794. As shown in FIG. 23, the third and fifth robotic movers 782 and 784 are beneficially linearly aligned with the first multi-station cleaning system 760, while the fourth and sixth robotic movers 783 and 785 are beneficially linearly aligned with the second multi-station cleaning system 775.

Figure 24:
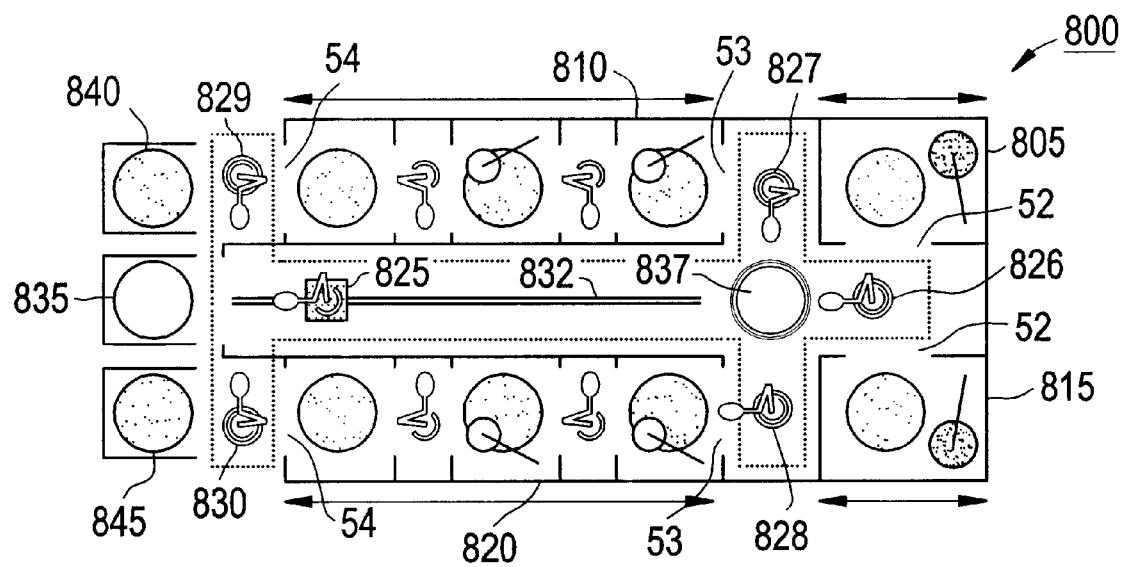
FIG. 24 is a schematic top-down view of a CMP system that is in accord with a thirteenth embodiment of the present invention.
Figure 25:
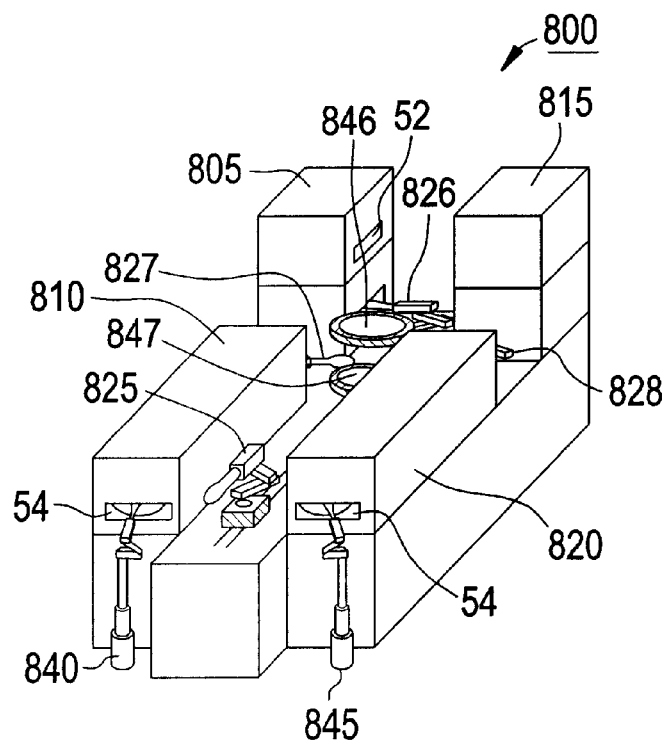
FIG. 25 is a schematic perspective view of a CMP system that is in accord with the thirteenth embodiment of the present invention, and which illustrates vertical stacked CMP polishing stations, a contaminate protection scheme, a robotic movement scheme, and a multiple level buffer station that are all generally applicable with the principles of the present invention.

A variation of the CMP system 750 is the thirteenth embodiment CMP system 800 shown in FIGS. 24 and 25. Referring now specifically to FIG. 24, the CMP system 800 includes a first subsystem comprised of a first stacked multi-station CMP polishing system 805 and a linearly aligned and elongated first multi-station cleaning system 810. The CMP system 800 further includes a second subsystem comprised of a second stacked multi-station CMP polishing system 815 and a linearly aligned and elongated second multi-station cleaning system 820. Beneficially, the first and second subsystems are aligned in parallel.

The CMP system 800 also includes a robotic system comprised of a first robotic mover 825, a second robotic mover 826, a third robotic mover 827, a fourth robotic mover 828, a fifth robotic mover 829, and a sixth robotic mover 830. The first robotic mover 825 is mounted on a track 832 that enables the first robotic mover 825 to move semiconductor wafers from a wafer load station 835 into a buffer station 837. The second robotic mover 826 removes semiconductor wafers from the buffer station 837 and selectively sends them, via ports 52, to the first stacked multi-station CMP polishing system 805 and to the second stacked multi-station CMP polishing system 815. The second robotic mover 826 also removes polished semiconductor wafers from the first stacked multi-station CMP polishing system 805 and from the second stacked multi-station CMP polishing system 815, via the ports 52, and sends them back to the buffer station 837. The second robotic mover 781 is capable of Z-axis motion.

The third robotic mover 827 moves polished semiconductor wafers from the buffer station 837 and inserts them, via a port 53, into the first multi-station cleaning system 810. The fourth robotic mover 828 moves polished semiconductor wafers from the buffer station 837 and inserts them, via a port 53, into the second multi-station cleaning system 820. Depending on the specific implementation, as described below, the third and fourth robotic movers 827 and 828 might be capable of Z-axis motion.

The fifth robotic mover 829 moves cleaned semiconductor wafers from the first multi-station cleaning system 810, via a port 54, into a first wafer unload station 840, while the sixth robotic mover 830 moves cleaned semiconductor wafers from the second multi-station cleaning system 820, via a port 54, into a second wafer unload station 845. As shown in FIG. 24, the third and fifth robotic movers 827 and 829 are beneficially linearly aligned with the first multi-station cleaning system 810, while the fourth and sixth robotic movers 828 and 830 are beneficially linearly aligned with the second multi-station cleaning system 830.

Turning now to FIG. 25, to increase semiconductor wafer handling capability, the buffer station 837 of the CMP system 800 includes a top wafer buffer 846 and a lower wafer buffer 847. This provides for temporary storage of multiple semiconductor wafers within the buffer station 837 at two levels. In one implementation, the third and fourth robotic movers 827 and 828 are capable of Z-axis motion so as to gain access to semiconductor wafers on the top wafer buffer 846. In another implementation, the buffer station 837 is capable of moving in the Z-axis such that the third and fourth robotic movers 827 and 828 can gain access to semiconductor wafers on the top wafer buffer 846.

Figure 26:
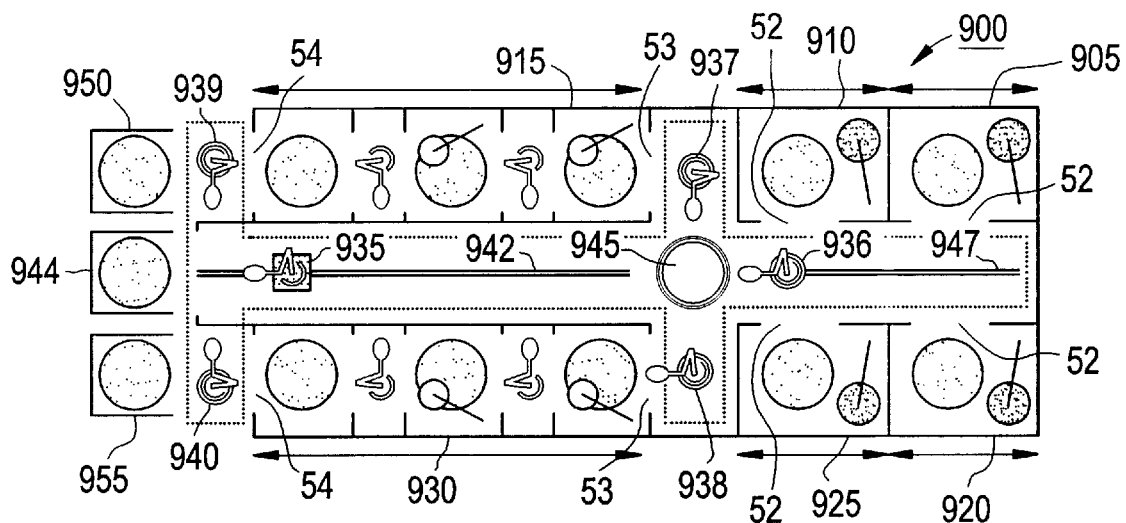
FIG. 26 is a schematic top-down view of a CMP system that is in accord with a fourteenth embodiment of the present invention.
Figure 27:
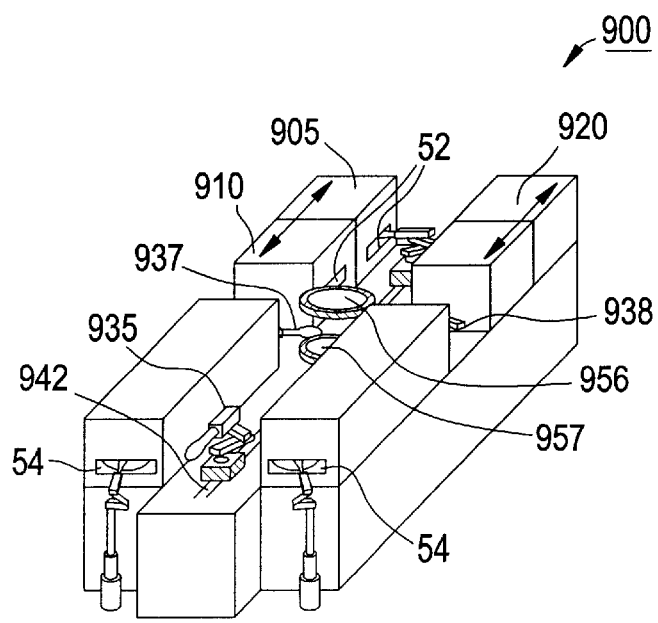
FIG. 27 is a schematic perspective view of a CMP system that is in accord with the fourteenth embodiment of the present invention, and which illustrates linearly aligned vertical stacked CMP polishing stations, a contaminate protection scheme, a robotic movement scheme, and a multiple level buffer station that are all generally applicable with the principles of the present invention.

It is also possible to use multiple level buffer stations with non-stacked CMP polishing systems. For example, FIGS. 26 and 27 illustrate a fourteenth embodiment CMP system 900. Referring now specifically to FIG. 26, the CMP system 900 includes a first subsystem comprised of a first CMP polishing system 905, a second CMP polishing system 910, and a linearly aligned and elongated first multi-station cleaning system 915. The CMP system 900 further includes a second subsystem comprised of a third CMP polishing system 920, a fourth CMP polishing system 925, and a linearly aligned and elongated second multi-station cleaning system 930. Beneficially, the first and second subsystems are aligned in parallel.

The CMP system 900 also includes a robotic system comprised of a first robotic mover 935, a second robotic mover 936, a third robotic mover 937, a fourth robotic mover 938, a fifth robotic mover 939, and a sixth robotic mover 940. The first robotic mover 935 is mounted on a track 942 that enables the first robotic mover 935 to move semiconductor wafers from a wafer load station 944 into a buffer station 945.

The second robotic mover 936 is mounted on a short track 947. The second robotic mover 936 removes semiconductor wafers from the buffer station 945 and selectively sends them to the first, second, third, and fourth CMP polishing systems 905, 910, 920, and 930, respectively, via ports 52. The second robotic mover 936 also removes polished semiconductor wafers from the first, second, third, and fourth CMP polishing systems 905, 910, 920, and 930, respectively, again via ports 52, and sends them back to the buffer station 945.

The third robotic mover 937 moves polished semiconductor wafers from the buffer station 945 and inserts them via a port 53 into the first multi-station cleaning system 915. The fourth robotic mover 828 moves polished semiconductor wafers from the buffer station 945 and inserts them via a port 53 into the second multi-station cleaning system 930. The fifth robotic mover 939 moves, via a port 54, cleaned semiconductor wafers from the first multi-station cleaning system 915 into a first wafer unload station 950, while the sixth robotic mover 940 moves, via a port 54, cleaned semiconductor wafers from the second multi-station cleaning system 930 into a second wafer unload station 955. As shown in FIG. 26, the third and fifth robotic movers 937 and 939 are beneficially linearly aligned with the first multi-station cleaning system 915, while the fourth and sixth robotic movers 938 and 940 are beneficially linearly aligned with the second multi-station cleaning system 940.

Turning now to FIG. 27, to increase semiconductor wafer handling capability, the buffer station 945 of the fourteenth embodiment CMP system 800 includes a top wafer buffer 956 and a lower wafer buffer 957. This enables temporary storage of multiple semiconductor wafers within the buffer station 945. The buffer station 945 can be capable of Z-axis motion, and/or the third and fourth robotic movers 937 and 938 can be capable of Z-axis motion to enable access to semiconductor wafers on the top wafer buffer 956.

FIGS. 26 and 27 show the first robotic mover 935 on a track 942. It is also possible to locate the wafer load station 944 on the track 942 and fix the first robotic mover 935 adjacent the buffer station 945.

Figure 28:
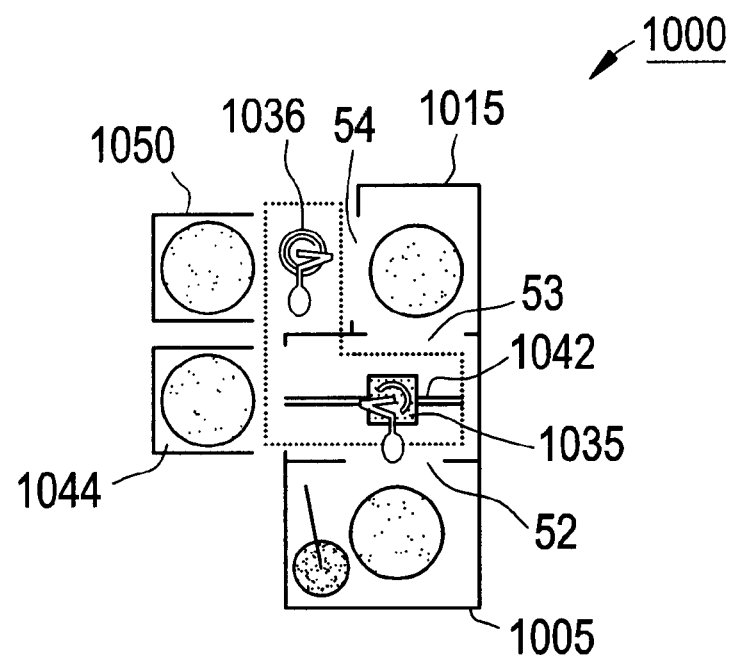
FIG. 28 is a schematic view of a CMP system that is in accord with a fifteenth embodiment of the present invention, and which illustrates a minimal systems comprised of a CMP polishing station, a cleaning station, two robotic movers, a load station, and an unload station.
Figure 29:
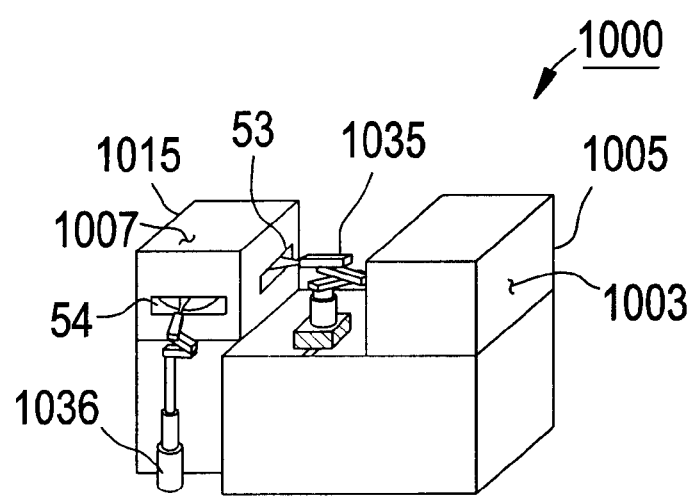
FIG. 29 is a schematic perspective view of a CMP system that is in accord with the fifteenth embodiment of the present invention, and which illustrates a contaminate protection scheme.

While the foregoing has generally described multi-station cleaning systems, such is not required. For example, FIGS. 28 and 29 illustrate a fifteenth embodiment CMP system 1000. Referring now specifically to FIG. 28, the CMP system 1000 includes a CMP polishing system 1005 and a cleaning system 1015.

The CMP system 1000 also includes a robotic system comprised of a first robotic mover 1035 and a second robotic mover 1036. The first robotic mover 1035 is mounted on a track 1042 that enables the first robotic mover 1035 to move semiconductor wafers from a wafer load station 1044 into the CMP polishing system 1005. The second robotic mover 1036 removes semiconductor wafers from the cleaning system 1015 and sends them to an unload station 1050. Access to the CMP polishing system 1005 is via a port 52, the entrance to the cleaning system 1015 is via a port 53, and the exit of the cleaning system 1015 is via a port 54.

Referring now specifically to FIG. 29, the CMP system 1000 is provided with a housing 1003 for the CMP polishing station 1005 and a housing 1007 for the cleaning system 1015. The housing 1003 retains debris produced during polishing inside the CMP polishing station 1005. The housing 1007 protects semiconductor wafers from contamination during cleaning.

Figure 30:
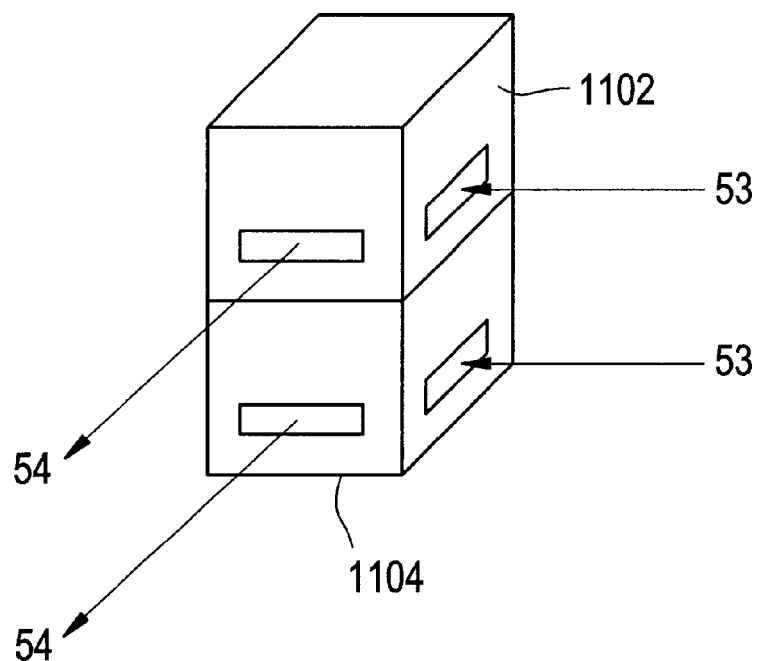
FIG. 30 is a schematic perspective view of stacked cleaning stations (or substations)

The foregoing has also generally described and illustrated "single level" cleaning systems. However, such is not required. For example, FIG. 30 illustrates a vertically stacked cleaning system 1100 comprised of a first cleaning sub-system 1102 and a second cleaning sub-system 1104. Each cleaning sub-system 1102 includes its own entrance port 53 and its own exit port 54. Furthermore, each cleaning sub-system can include only one function, such as a cleaner or a rinser, or each cleaning sub-system can include multiple functions. Vertically stacked cleaning systems are highly advantageous in reducing the footprint of the overall CMP system. It should be understood that a vertically stacked cleaning system 1100 can be used in any of the illustrated embodiments.

Figure 31:
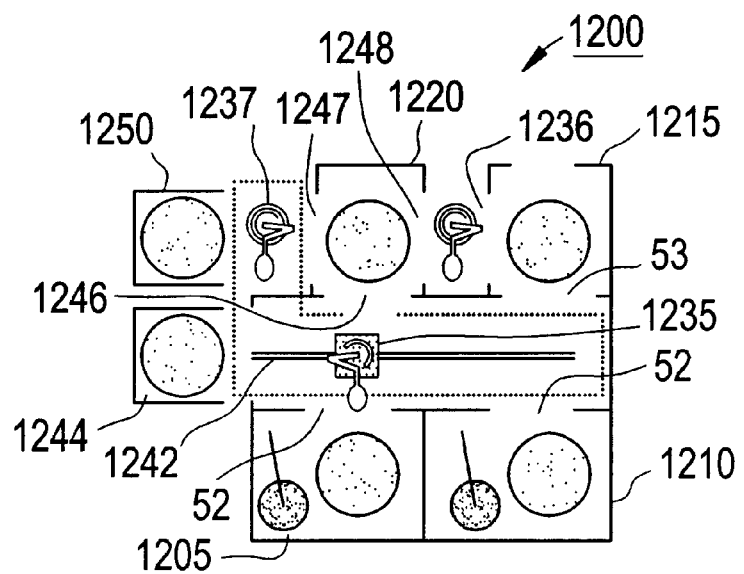
FIG. 31 is a schematic view of a CMP system that is in accord with a sixteenth embodiment of the present invention, and which illustrates a multi-station CMP polishing system, a vertically stacked cleaning system, three robotic movers, a load station, and an unload station.

A final embodiment CMP system 1200 is illustrated in FIG. 31. That CMP system 1200 includes a first CMP polishing system 1205, a second CMP polishing system 1210, a cleaning system 1215, and a metrology station 1220.

The CMP system 1200 also includes a robotic system comprised of a first robotic mover 1235, a second robotic mover 1236, and a third robotic mover 1237. The first robotic mover 1235 is mounted on a track 1242 that enables the first robotic mover 1235 to selectively move semiconductor wafers from a wafer load station 1244 into and out of either the first CMP polishing system 1205 or the second CMP polishing system 1210 via ports 52. Semiconductor wafers removed from the first and second CMP polishing systems are moved into either the metrology station 1220, via a port 1246, or into the cleaning system 1215 via a port 53.

If a semiconductor wafer is moved into the metrology station 1220, the semiconductor wafer is tested for any of a number of parameter, including flatness and/or conductivity.

If the tested semiconductor wafer is defective, it can selectively be moved by the first robotic mover 1235 back into the first or second CMP polishing systems, or it can be removed via a port 1247 by the third robotic mover 1237. However, if the semiconductor wafer is acceptable, the second robotic mover 1236 moves the semiconductor wafer into the cleaning system 1215 via a port 1248 and via a port 54.

If a semiconductor wafer is moved into the cleaning system 1215, the semiconductor wafer is cleaned, beneficially using brush cleaning, a water rinse, and a drying step. The cleaned semiconductor wafer is then moved into the metrology station 1220. The metrology station then tests the semiconductor wafer for any of a number of parameter, including flatness and/or conductivity. If the tested semiconductor wafer is defective, it can selectively be moved by the first robotic mover 1235 back into the first or second CMP polishing systems, or it can be removed by the third robotic mover 1237. However, if the semiconductor wafer is acceptable, the third robotic mover 1237 moves the semiconductor wafer into the an unload station 1250.

The CMP system 1200 can include a vertically stacked cleaning system, as shown in FIG. 30. In that case, the first and second robotic movers beneficially move vertically. The CMP system 1200 can also include a vertically stacked CMP system. Again, in such cases the first and second robotic movers beneficially move vertically.

It will be apparent to those skilled in the art that various modifications and variation can be made in the present invention without departing from the spirit or scope of the invention. Thus, it is intended that the present invention covers the modifications and variations of this invention provided they come within the scope of the appended claims and their equivalents.

What is claimed is:

1. A semiconductor wafer processing system, comprising:
   a wafer load station for receiving semiconductor wafers;
   a CMP polishing system for polishing semiconductor wafers, said CMP polishing system having a polishing pad with a contact surface for contacting a semiconductor wafer, wherein said contact surface has a contact area that is less than a surface area of a contacted semiconductor wafer;
   a multi-station cleaning system for cleaning polished semiconductor wafers;
   an unload station for receiving polished and cleaned semiconductor wafers;
   a first robotic mover for moving semiconductor wafers from said wafer load station into said CMP polishing system; and
   a second robotic mover for moving cleaned semiconductor wafers from said multi-station cleaning system to said unload station.

2. A semiconductor wafer processing system according to claim 1, wherein CMP polishing system is a multi-station CMP system having at least two mini-polishers.

3. A semiconductor wafer processing system according to claim 2, wherein said first robotic mover is further for moving polished semiconductor wafers from said multi-station CMP polishing system into said multi-station cleaning system.

4. A semiconductor wafer processing system according to claim 1, wherein said multi-station cleaning system includes a water rinse.

5. A semiconductor wafer processing system according to claim 1, wherein said multi-station cleaning system includes a brush.

6. A semiconductor wafer processing system according to claim 1, wherein said multi-station cleaning system includes a wafer transfer mechanism for moving semiconductor wafers within said multi-station cleaning system.

7. A semiconductor wafer processing system according to claim 6, wherein said multi-station cleaning system further includes a third cleaning station, and wherein said first cleaning station, said second cleaning station, and said third cleaning station are linearly aligned.

8. A semiconductor wafer processing system according to claim 7, wherein said unload station is linearly aligned with said first cleaning station, with said second cleaning station, and with said third cleaning station.

9. A semiconductor wafer processing system according to claim 7, wherein said second robotic mover is disposed between said unload station and said multi-station cleaning system.

10. A semiconductor wafer processing system according to claim 7, wherein said CMP polishing system is linearly aligned with said multi-station cleaning system.

11. A semiconductor wafer processing system according to claim 10, wherein said wafer load station is on a track.

12. A semiconductor wafer processing system according to claim 10, wherein said wafer load station is adjacent said wafer unload station.

13. A semiconductor wafer processing system according to claim 2, wherein said first robotic mover is further for moving semiconductor wafers from one mini-polisher to another mini-polisher of said multi-station CMP polishing system.

14. A semiconductor wafer processing system according to claim 2, wherein said multi-station CMP polishing system includes at least two mini-polishing stations, and wherein a first polishing station and a second polishing station are linearly aligned.

15. A semiconductor wafer processing system according to claim 2, wherein said multi-station CMP polishing system and said multi-station cleaning system are parallel.

16. A semiconductor wafer processing system according to claim 15, wherein said first robotic mover runs along a track that is between said multi-station CMP polishing system and said multi-station cleaning system.

17. A semiconductor wafer processing system according to claim 1, wherein said wafer load station moves in a vertical direction to enable access to semiconductor wafers in vertically stacked wafer load cassettes.

18. A semiconductor wafer processing system according to claim 17, further including a vertical motion inducing device.

19. A semiconductor wafer processing system according to claim 1, wherein said wafer unload station moves in a vertical direction to enable access to semiconductor wafers in vertically stacked wafer unload cassettes.

20. A semiconductor wafer processing system according to claim 19, further including a vertical motion inducing device.

21. A semiconductor wafer processing system according to claim 1, wherein said unload station is linearly aligned with said multi-station cleaning system.

22. A semiconductor wafer processing system according to claim 1, wherein said multi-station cleaning system includes a housing.

23. A semiconductor wafer processing system according to claim 22, wherein said housing has an entrance port and an exit port.

24. A semiconductor wafer processing system according to claim 1, wherein said multi-station cleaning system includes a metrology station.

25. A semiconductor wafer processing system according to claim 2, wherein said multi-station CMP polishing system includes a housing.

26. A semiconductor wafer processing system according to claim 25, wherein said housing has an access port.

27. A semiconductor wafer processing system according to claim 1, wherein said first robotic mover is on a track.

28. A semiconductor wafer processing system according to claim 2, wherein said CMP polishing system has vertically stacked mini-polishers.

29. A semiconductor wafer processing system according to claim 28, wherein said first robotic mover has Z-axis motion.

30. A semiconductor wafer processing system according to claim 1, wherein said multi-station cleaning system includes vertically stacked cleaning stations.

31. A semiconductor wafer processing system, comprising:
   a wafer load station for receiving semiconductor wafers;
   a first multi-station CMP polishing system for polishing semiconductor wafers, said first multi-station CMP polishing system having a polishing pad with a contact surface for contacting a semiconductor wafer, wherein said contact surface has a contact area that is less than a surface area of a contacted semiconductor wafer;
   a second multi-station CMP polishing system for polishing semiconductor wafers, said second multi-station CMP polishing system having a polishing pad with a contact surface for contacting a semiconductor wafer, wherein said contact surface has a contact area that is less than a surface area of a contacted semiconductor wafer;
   a first multi-station cleaning system for cleaning polished semiconductor wafers;
   a second multi-station cleaning system for cleaning polished semiconductor wafers;
   a first unload station for receiving polished and cleaned semiconductor wafers;
   a second unload station for receiving polished and cleaned semiconductor wafers;
   a first robotic mover for moving semiconductor wafers from said wafer load station into said first multi-station CMP polishing system and into said second multi-station CMP polishing system;
   a second robotic mover for moving cleaned semiconductor wafers from the first multi-station cleaning system to said first unload station; and
   a third robotic mover for moving cleaned semiconductor wafers from the second multi-station cleaning system to said second unload station.

32. A semiconductor wafer processing system according to claim 31, wherein said first CMP polishing system has vertically stacked mini-polishers.

33. A semiconductor wafer processing system according to claim 32, wherein said second CMP polishing system has vertically stacked mini-polishers.

34. A semiconductor wafer processing system according to claim 32, wherein said first robotic mover has Z-axis motion.

35. A semiconductor wafer processing system according to claim 31, wherein said first CMP polishing system includes a plurality of linearly aligned mini-polishers.

36. A semiconductor wafer processing system according to claim 35, wherein said second CMP polishing system includes a plurality of linearly aligned mini-polishers.

37. A semiconductor wafer processing system according to claim 31, wherein said first multi-station CMP polishing system and said first multi-station cleaning system are linearly aligned, wherein said second multi-station CMP polishing system and said second multi-station cleaning system are linearly aligned, and wherein said first multi-station CMP polishing system and said second multi-station CMP polishing system are parallel.

38. A semiconductor wafer processing system according to claim 31, wherein said first robotic mover runs along a track that is parallel to said first multi-station cleaning system.

39. A semiconductor wafer processing system according to claim 38, wherein said wafer load station is linearly aligned with said track.

40. A semiconductor wafer processing system according to claim 38, wherein said first robotic mover runs along a track that is between said first multi-station cleaning system and said second multi-station cleaning system.

41. A semiconductor wafer processing system according to claim 31, wherein said first unload station is linearly aligned with said first multi-station cleaning system.

42. A semiconductor wafer processing system according to claim 40, wherein said second unload station is linearly aligned with said second multi-station cleaning system.

43. A semiconductor wafer processing system according to claim 31, wherein said first multi-station cleaning system includes a water rinse.

44. A semiconductor wafer processing system according to claim 31, wherein said first multi-station cleaning system includes a brush.

45. A semiconductor wafer processing system according to claim 31, wherein said first multi-station cleaning system includes a wafer transfer mechanism for moving semiconductor wafers within said first multi-station cleaning system.

46. A semiconductor wafer processing system according to claim 45, wherein said first multi-station cleaning system further includes three linearly aligned cleaning stations.

47. A semiconductor wafer processing system according to claim 46, wherein said second robotic mover is disposed between said first unload station and said first multi-station cleaning system.

48. A semiconductor wafer processing system according to claim 31, wherein said wafer load station moves in a vertical direction to enable access to semiconductor wafers in vertically stacked wafer load cassettes.

49. A semiconductor wafer processing system according to claim 48, further including a vertical motion inducing device.

50. A semiconductor wafer processing system according to claim 31, wherein said wafer unload station moves in a vertical direction to enable access to semiconductor wafers in vertically stacked wafer unload cassettes.

51. A semiconductor wafer processing system according to claim 50, further including a vertical motion inducing device.

52. A semiconductor wafer processing system according to claim 31, wherein said multi-station cleaning system includes a housing.

53. A semiconductor wafer processing system according to claim 52, wherein said housing has an entrance port and an exit port.

54. A semiconductor wafer processing system according to claim 31, wherein said first multi-station cleaning system includes a metrology station.

55. A semiconductor wafer processing system according to claim 31, wherein said first multi-station CMP polishing system includes a housing.

56. A semiconductor wafer processing system according to claim 55, wherein said housing has an access port.

57. A semiconductor wafer processing system according to claim 31, wherein said first multi-station cleaning system includes vertically stacked cleaning stations.

58. A semiconductor wafer processing system, comprising:

a wafer load station for storing semiconductor wafers;

a first CMP polishing system for polishing semiconductor wafers, said first CMP polishing system having a polishing pad with a contact surface for contacting a semiconductor wafer, wherein said contact surface has a contact area that is less than a surface area of a contacted semiconductor wafer;

a second CMP polishing system for polishing semiconductor wafers, said second CMP polishing system having a polishing pad with a contact surface for contacting a semiconductor wafer, wherein said contact surface has a contact area that is less than a surface area of a contacted semiconductor wafer;

a first multi-station cleaning system for cleaning polished semiconductor wafers;

a second multi-station cleaning system for cleaning polished semiconductor wafers;

a first unload station for receiving polished and cleaned semiconductor wafers;

a second unload station for receiving polished and cleaned semiconductor wafers;

a first robotic mover for moving semiconductor wafers from said wafer load station into said first CMP polishing system and into said second CMP polishing system;

a second robotic mover for moving semiconductor wafers from said first CMP polishing system into first multi-station cleaning system;

a third robotic mover for moving polished semiconductor wafers from said second CMP polishing system into said second multi-station cleaning system;

a fourth robotic mover for moving cleaned semiconductor wafers from said first multi-station cleaning system into said first unload station; and a fifth robotic mover for moving cleaned semiconductor wafers from said second multi-station cleaning system into second first unload station.

59. A semiconductor wafer processing system according to claim 58, wherein said first CMP polishing system has vertically stacked mini-polishers.

60. A semiconductor wafer processing system according to claim 59, wherein said first robotic mover has Z-axis motion.

61. A semiconductor wafer processing system according to claim 58, wherein said first CMP polishing system and said first multi-station cleaning system are linearly aligned, wherein said second CMP polishing system and said second multi-station cleaning system are linearly aligned, and wherein said first CMP polishing system and said second CMP polishing system are parallel.

62. A semiconductor wafer processing system according to claim 61, wherein said first robotic mover runs along a track that is parallel to said first multi-station cleaning system.

63. A semiconductor wafer processing system according to claim 62, wherein said wafer load station is linearly aligned with said track.

64. A semiconductor wafer processing system according to claim 62, wherein said first robotic mover runs along a track that is between said first multi-station cleaning system and said second multi-station cleaning system.

65. A semiconductor wafer processing system according to claim 61, wherein said first unload station is linearly aligned with said first multi-station cleaning system.

66. A semiconductor wafer processing system according to claim 65, wherein said second unload station is linearly aligned with said second multi-station cleaning system.

67. A semiconductor wafer processing system according to claim 58, wherein said second robotic mover is disposed between said first CMP polishing system and said first multi-station cleaning system.

68. A semiconductor wafer processing system according to claim 67, wherein said third robotic mover is disposed between said second CMP polishing system and said second multi-station cleaning system.

69. A semiconductor wafer processing system according to claim 58, wherein said wafer load station moves in a vertical direction to enable access to semiconductor wafers in vertically stacked wafer load cassettes.

70. A semiconductor wafer processing system according to claim 69, further including a vertical motion inducing device.

71. A semiconductor wafer processing system according to claim 58, wherein said wafer unload station moves in a vertical direction to enable access to semiconductor wafers in vertically stacked wafer unload cassettes.

72. A semiconductor wafer processing system according to claim 71, further including a vertical motion inducing device.

73. A semiconductor wafer processing system according to claim 58, wherein said first multi-station cleaning system includes a housing.

74. A semiconductor wafer processing system according to claim 73, wherein said housing has an entrance port and an exit port.

75. A semiconductor wafer processing system according to claim 73, wherein said first multi-station cleaning system includes a metrology station.

76. A semiconductor wafer processing system according to claim 73, wherein said first CMP polishing system includes a housing.

77. A semiconductor wafer processing system according to claim 76, wherein said housing has two access ports.

78. A semiconductor wafer processing system according to claim 58, wherein said first multi-station cleaning system includes vertically stacked cleaning stations.

79. A semiconductor wafer processing system, comprising:

a wafer load station for storing semiconductor wafers;

a first multi-station CMP polishing system for polishing semiconductor wafers, said first multi-station CMP polishing system having a polishing pad with a contact surface for contacting a semiconductor wafer, wherein said contact surface has a contact area that is less than a surface area of a contacted semiconductor wafer;

a second multi-station CMP polishing system for polishing semiconductor wafers, said second multi-station CMP polishing system having a polishing pad with a contact surface for contacting a semiconductor wafer, wherein said contact surface has a contact area that is less than a surface area of a contacted semiconductor wafer;

a first multi-station cleaning system for cleaning polished semiconductor wafers;

a second multi-station cleaning system for cleaning polished semiconductor wafers;

a first unload station for receiving semiconductor wafers;

a second unload station for receiving semiconductor wafers;

a buffer station for temporarily holding semiconductor wafers;

a first robotic mover for moving semiconductor wafers from said buffer station into said first multi-station CMP polishing system and into said second multi-station CMP polishing system, said first robotic mover further for moving semiconductor wafers from said first multi-station CMP polishing system and from said second multi-station CMP polishing into said first multi-station cleaning system and into said second multi-station cleaning system; and a second robotic mover for moving semiconductor wafers from said wafer load station to said buffer station, for moving cleaned semiconductor wafers from said first and second multi-station cleaning systems to said first and second unload stations.

80. A semiconductor wafer processing system according to claim 79, wherein said first multi-station CMP polishing system and said first multi-station cleaning system are linearly aligned, wherein said second multi-station CMP polishing system and said second multi-station cleaning system are linearly aligned, and wherein said first multi-station CMP polishing system and said second multi-station CMP polishing system are adjacent and parallel.

81. A semiconductor wafer processing system according to claim 79, wherein said first robotic mover runs along a track that is parallel to said first multi-station cleaning system.

82. A semiconductor wafer processing system according to claim 80, wherein said first robotic mover runs along a track that is between said first multi-station CMP polishing system and said second multi-station CMP polishing system.

83. A semiconductor wafer processing system according to claim 79, wherein said second robotic mover runs along a track that is parallel to said first unload station, to said second unload station, and to said wafer station.

84. A semiconductor wafer processing system according to claim 83, wherein said first robotic mover moves along a track that is perpendicular to said track of said second robotic mover.

85. A semiconductor wafer processing system according to claim 79, wherein said wafer load station moves in a vertical direction to enable access to semiconductor wafers in vertically stacked wafer load cassettes.

86. A semiconductor wafer processing system according to claim 85, further including a vertical motion inducing device.

87. A semiconductor wafer processing system according to claim 79, wherein said first unload station moves in a vertical direction to enable access to semiconductor wafers in vertically stacked wafer unload cassettes.

88. A semiconductor wafer processing system according to claim 87, further including a vertical motion inducing device.

89. A semiconductor wafer processing system according to claim 79, wherein said second robotic mover moves in a vertical direction.

90. A semiconductor wafer processing system according to claim 79, wherein said first multi-station cleaning system includes a housing.

91. A semiconductor wafer processing system according to claim 90, wherein said housing has an entrance port and an exit port.

92. A semiconductor wafer processing system according to claim 79, wherein said first multi-station cleaning system includes a metrology station.

93. A semiconductor wafer processing system according to claim 79, wherein said first multi-station CMP polishing system includes a housing.

94. A semiconductor wafer processing system according to claim 93, wherein said housing has two access ports.

95. A semiconductor wafer processing system according to claim 79, wherein said first multi-station cleaning system includes vertically stacked cleaning stations.

96. A semiconductor wafer processing system, comprising:

a wafer load station for storing semiconductor wafers;

a first CMP polishing system for polishing semiconductor wafers, said first CMP polishing system having a polishing pad with a contact surface for contacting a semiconductor wafer, wherein said contact surface has a contact area that is less than a surface area of a contacted semiconductor wafer;

a second CMP polishing system for polishing semiconductor wafers, said second CMP polishing system having a polishing pad with a contact surface for contacting a semiconductor wafer, wherein said contact surface has a contact area that is less than a surface area of a contacted semiconductor wafer;

a first multi-station cleaning system for cleaning polished semiconductor wafers;

a second multi-station cleaning system for cleaning polished semiconductor wafers;

a first unload station for receiving cleaned and polished semiconductor wafers;

a second unload station for receiving cleaned and polished semiconductor wafers;

a wafer buffer station;

a first robotic mover for moving semiconductor wafers from said wafer load station into said wafer buffer station a second robotic mover for moving semiconductor wafers from said wafer buffer station into said first CMP polishing system and into said second CMP polishing system, said second robotic mover further for moving semiconductor wafers from said first CMP polishing system and from said second CMP polishing system into said wafer buffer station;

a third robotic mover for moving polished semiconductor wafers from the wafer buffer station to said first multi-station cleaning system;

a fourth robotic mover for moving polished semiconductor wafers from the wafer buffer station to said second multi-station cleaning system;

a fifth robotic mover for moving cleaned semiconductor wafers from said first multi-station cleaning system to said first unload station; and a sixth robotic mover for moving cleaned semiconductor wafers from said second multi-station cleaning system to said second unload station.

97. A semiconductor wafer processing system according to claim 96, wherein said first CMP polishing system includes a plurality of vertically stacked polishing stations.

98. A semiconductor wafer processing system according to claim 97, wherein said second robotic mover is further for moving semiconductor wafers from at least a first polishing station of said first CMP polishing system to a second polishing station of said first CMP polishing system.

99. A semiconductor wafer processing system according to claim 97, wherein said second robotic mover has Z-axis motion.

100. A semiconductor wafer processing system according to claim 96, wherein said wafer buffer station includes a plurality of vertically stacked buffer pads, and wherein each of said vertically stacked buffer pads is for receiving semiconductor wafers.

101. A semiconductor wafer processing system according to claim 100, wherein said wafer buffer station has Z-axis motion.

102. A semiconductor wafer processing system according to claim 96, wherein said first CMP polishing system includes at least two polishing subsystems.

103. A semiconductor wafer processing system according to claim 102, wherein each of said at least two polishing subsystems is comprised of a plurality of vertically stacked polishing stations.

104. A semiconductor wafer processing system according to claim 102, wherein said at least two polishing subsystems are adjacent.

105. A semiconductor wafer processing system according to claim 104, wherein said second robotic mover runs along a track that is between said first CMP polishing system and said second CMP polishing system.

106. A semiconductor wafer processing system according to claim 96, wherein said first CMP polishing system and said first multi-station cleaning system are linearly aligned.

107. A semiconductor wafer processing system according to claim 96, wherein said first robotic mover runs along a track that is parallel to said first multi-station cleaning system.

108. A semiconductor wafer processing system according to claim 96, wherein said first CMP polishing system and said first multi-station cleaning system are linearly aligned, wherein said second CMP polishing system and said second multi-station cleaning system are linearly aligned, and wherein said first multi-station cleaning system and said second multi-station cleaning system are adjacent and parallel.

109. A semiconductor wafer processing system according to claim 108, wherein said first robotic mover runs along a track that is parallel to said first multi-station cleaning system.

110. A semiconductor wafer processing system according to claim 108, wherein said first robotic mover runs along a track that is between said first multi-station cleaning system and said second multi-station cleaning system.

111. A semiconductor wafer processing system according to claim 108, wherein said wafer load station runs along a track that is between said first multi-station cleaning system and said second multi-station cleaning system.

112. A semiconductor wafer processing system according to claim 96, wherein said first unload station is linearly aligned with said first multi-station cleaning system.

113. A semiconductor wafer processing system according to claim 96, wherein said third robotic mover is capable of Z-axis motion.

114. A semiconductor wafer processing system according to claim 96, wherein said first unload station moves in a vertical direction.

115. A semiconductor wafer processing system according to claim 114, further including a vertical motion inducing device.

116. A semiconductor wafer processing system according to claim 96, wherein said first multi-station cleaning system includes a housing.

117. A semiconductor wafer processing system according to claim 116, wherein said housing has an entrance port and an exit port.

118. A semiconductor wafer processing system according to claim 96, wherein said first multi-station cleaning system includes a metrology station.

119. A semiconductor wafer processing system according to claim 96, wherein said first CMP polishing system includes a housing.

120. A semiconductor wafer processing system according to claim 119, wherein said housing has an access port.

121. A semiconductor wafer processing system according to claim 96, wherein said first multi-station cleaning system includes vertically stacked cleaning stations.

122. A semiconductor wafer processing system, comprising:
a wafer load station for storing semiconductor wafers;
a first CMP polishing system for polishing semiconductor wafers, said first CMP polishing system having a polishing pad with a contact surface for contacting a semiconductor wafer, wherein said contact surface has a contact area that is less than a surface area of a contacted semiconductor wafer;
a second CMP polishing system for polishing semiconductor wafers, said second CMP polishing system having a polishing pad with a contact surface for contacting a semiconductor wafer, wherein said contact surface has a contact area that is less than a surface area of a contacted semiconductor wafer;
a first multi-station cleaning system for cleaning polished semiconductor wafers;
a second multi-station cleaning system for cleaning polished semiconductor wafers;
a first unload station for storing semiconductor wafers;
a second unload station for storing semiconductor wafers;
a wafer buffer station;
a first robotic mover for moving semiconductor wafers from said wafer load station into said wafer buffer station;
a second robotic mover for moving semiconductor wafers from said wafer buffer station into said first CMP polishing system and into said second CMP polishing system;
a third robotic mover for moving polished semiconductor wafers from said first CMP polishing system into said first multi-station cleaning system;
a fourth robotic mover for moving polished semiconductor wafers from said second CMP polishing system into said second multi-station cleaning system;
a fifth robotic mover for moving cleaned semiconductor wafers from said first multi-station cleaning system to said first unload station; and
a sixth robotic mover for moving cleaned semiconductor wafers from said second multi-station cleaning system to said second unload station.

123. A semiconductor wafer processing system according to claim 122, wherein said first CMP polishing system includes a first plurality of vertically stacked polishing stations.

124. A semiconductor wafer processing system according to claim 122, wherein said second robotic mover is capable of Z-axis motion.

125. A semiconductor wafer processing system according to claim 124, wherein said third robotic mover is capable of Z-axis motion.

126. A semiconductor wafer processing system according to claim 123, wherein said wafer buffer station includes a plurality of vertically stacked buffer pads.

127. A semiconductor wafer processing system according to claim 123, wherein said wafer buffer station is capable of Z-axis motion.

128. A semiconductor wafer processing system according to claim 122, wherein said first CMP polishing system and said first multi-station cleaning system are linearly aligned, wherein said second CMP polishing system and said second multi-station cleaning system are linearly aligned, and wherein said first multi-station cleaning system and said second multi-station cleaning system are adjacent and parallel.

129. A semiconductor wafer processing system according to claim 128, wherein said first robotic mover runs along a track that is parallel to said first multi-station cleaning system.

130. A semiconductor wafer processing system according to claim 129, wherein said first robotic mover runs along a track that is between said first multi-station cleaning system and said second multi-station cleaning system.

131. A semiconductor wafer processing system according to claim 128, wherein said first unload station is linearly aligned with said first multi-station cleaning system.

132. A semiconductor wafer processing system according to claim 131, wherein said second unload station is linearly aligned with said second multi-station cleaning system.

133. A semiconductor wafer processing system according to claim 122, wherein said first multi-station cleaning system includes a housing.

134. A semiconductor wafer processing system according to claim 133, wherein said housing has an entrance port and an exit port.

135. A semiconductor wafer processing system according to claim 122, wherein said first multi-station cleaning system includes a metrology station.

136. A semiconductor wafer processing system according to claim 135, wherein said first CMP polishing system includes a housing.

137. A semiconductor wafer processing system according to claim 136, wherein said housing has two ports.

138. A semiconductor wafer processing system according to claim 122, wherein said first multi-station cleaning system includes vertically stacked cleaning stations.

139. A semiconductor wafer processing system, comprising:
   a wafer load station for storing semiconductor wafers;
   a first CMP polishing system for polishing semiconductor wafers, said first CMP polishing system having a polishing pad with a contact surface for contacting a semiconductor wafer, wherein said contact surface has a contact area that is less than a surface area of a contacted semiconductor wafer;
   a second CMP polishing system for polishing semiconductor wafers, said second CMP polishing system having a polishing pad with a contact surface for contacting a semiconductor wafer, wherein said contact surface has a contact area that is less than a surface area of a contacted semiconductor wafer;
   a first multi-station cleaning system for cleaning polished semiconductor wafers;
   a second multi-station cleaning system for cleaning polished semiconductor wafers;
   a first unload station for storing semiconductor wafers;
   a second unload station for storing semiconductor wafers;
   a first robotic mover for moving semiconductor wafers from said wafer load station into said first CMP polishing system and into said second CMP polishing system;
   a second robotic mover for moving polished semiconductor wafers from said first CMP polishing system into said first multi-station cleaning system;
   a third robotic mover for moving polished semiconductor wafers from said second CMP polishing system into said second multi-station cleaning system;
   a fourth robotic mover for moving cleaned semiconductor wafers from said first multi-station cleaning system to said first unload station; and
   a fifth robotic mover for moving cleaned semiconductor wafers from said second multi-station cleaning system to said second unload station.

140. A semiconductor wafer processing system according to claim 139, wherein said first CMP polishing system includes a first plurality of vertically stacked polishing stations.

141. A semiconductor wafer processing system according to claim 139, wherein said first robotic mover is capable of Z-axis motion.

142. A semiconductor wafer processing system according to claim 141, wherein said second robotic mover is capable of Z-axis motion.

143. A semiconductor wafer processing system according to claim 142, wherein said third robotic mover is capable of Z-axis motion.

144. A semiconductor wafer processing system according to claim 139, wherein said first CMP polishing system and said first multi-station cleaning system are linearly aligned, wherein said second CMP polishing system and said second multi-station cleaning system are linearly aligned, and wherein said first multi-station cleaning system and said second multi-station cleaning system are adjacent and parallel.

145. A semiconductor wafer processing system according to claim 144, wherein said wafer load station moves along a track that is parallel to said first multi-station cleaning system.

146. A semiconductor wafer processing system according to claim 145, wherein track that is between said first multi-station cleaning system and said second multi-station cleaning system.

147. A semiconductor wafer processing system according to claim 139, wherein said first unload station is linearly aligned with said first multi-station cleaning system.

148. A semiconductor wafer processing system according to claim 147, wherein said second unload station is linearly aligned with said second multi-station cleaning system.

149. A semiconductor wafer processing system according to claim 139, wherein said first multi-station cleaning system includes a housing.

150. A semiconductor wafer processing system according to claim 149, wherein said housing has an entrance port and an exit port.

151. A semiconductor wafer processing system according to claim 139, wherein said first multi-station cleaning system includes a metrology station.

152. A semiconductor wafer processing system according to claim 139, wherein said first CMP polishing system includes a housing.

153. A semiconductor wafer processing system according to claim 152, wherein said housing has two ports.

154. A semiconductor wafer processing system according to claim 139, wherein said first multi-station cleaning system includes vertically stacked cleaning stations.

155. A semiconductor wafer processing system, comprising:

a wafer load station for receiving semiconductor wafers;

a CMP polishing system for polishing semiconductor wafers, CMP polishing system having a polishing pad with a contact surface for contacting a semiconductor wafer, wherein said contact surface has a contact area that is less than a surface area of a contacted semiconductor wafer;

a multi-station cleaning system for cleaning polished semiconductor wafers;

an unload station for receiving polished and cleaned semiconductor wafers;

a buffer station;

a first robotic mover for moving received semiconductor wafers from said wafer load station into said buffer station, said first robotic mover further for moving cleaned semiconductor wafers from said multi-station cleaning system into said unload station; and a second robotic mover for moving semiconductor wafers from said buffer station into said CMP polishing system, said second robotic mover further for moving polished semiconductor wafers from said CMP polishing system into said multi-station cleaning system.

156. A semiconductor wafer processing system according to claim 155, wherein said CMP polishing system is a multi-station CMP system having at least two mini-polishers.

157. A semiconductor wafer processing system according to claim 155, wherein said multi-station cleaning system includes a water rinse.

158. A semiconductor wafer processing system according to claim 155, wherein said multi-station cleaning system includes a brush.

159. A semiconductor wafer processing system according to claim 155, wherein said multi-station cleaning system includes a wafer transfer mechanism for moving semiconductor wafers within said multi-station cleaning system.

160. A semiconductor wafer processing system according to claim 159, wherein said multi-station cleaning system further includes a third cleaning station, and wherein said first cleaning station, said second cleaning station, and said third cleaning station are linearly aligned.

161. A semiconductor wafer processing system according to claim 160, wherein said unload station is linearly aligned with said first cleaning station, with said second cleaning station, and with said third cleaning station.

162. A semiconductor wafer processing system according to claim 155, wherein said first robotic mover is disposed between said unload station and said multi-station cleaning system.

163. A semiconductor wafer processing system according to claim 155, wherein said wafer load station is adjacent said unload station.

164. A semiconductor wafer processing system according to claim 156, wherein said second robotic mover is further for moving semiconductor wafers from one mini-polisher to another mini-polisher of said multi-station CMP polishing system.

165. A semiconductor wafer processing system according to claim 156, wherein said multi-station CMP polishing system and said multi-station cleaning system are parallel.

166. A semiconductor wafer processing system according to claim 165, wherein said second robotic mover runs along a track.

167. A semiconductor wafer processing system according to claim 155, wherein said wafer load station moves in a vertical direction to enable access to semiconductor wafers in vertically stacked wafer load cassettes.

168. A semiconductor wafer processing system according to claim 167, further including a vertical motion inducing device.

169. A semiconductor wafer processing system according to claim 155, wherein said wafer unload station moves in a vertical direction to enable access to semiconductor wafers in vertically stacked wafer unload cassettes.

170. A semiconductor wafer processing system according to claim 169, further including a vertical motion inducing device.

171. A semiconductor wafer processing system according to claim 155, wherein said unload station is linearly aligned with said multi-station cleaning system.

172. A semiconductor wafer processing system according to claim 155, wherein said multi-station cleaning system includes a housing.

173. A semiconductor wafer processing system according to claim 172, wherein said housing has an entrance port and an exit port.

174. A semiconductor wafer processing system according to claim 155, wherein said multi-station cleaning system includes a metrology station.

175. A semiconductor wafer processing system according to claim 156, wherein said CMP polishing system includes a housing.

176. A semiconductor wafer processing system according to claim 175, wherein said housing has an access port.

177. A semiconductor wafer processing system according to claim 155, wherein said second robotic mover is on a track.

178. A semiconductor wafer processing system according to claim 155, wherein said first multi-station cleaning system includes vertically stacked cleaning stations.

179. A method of polishing a semiconductor wafer, comprising:

receiving a semiconductor wafer having a surface area at a load station;

transferring the received semiconductor wafer from the load station to a polishing station;

polishing the received semiconductor wafer using a polishing pad and a chemical slurry, wherein the polishing pad contacts less than the first surface area;

transferring the polished semiconductor wafer from the polishing station to a cleaning station;

cleaning the polished semiconductor wafer in the cleaning station;

rinsing the cleaned semiconductor wafer in the cleaning station;

drying the rinsed semiconductor wafer in the cleaning station; and transferring the dried semiconductor wafer from the cleaning station to an unload station.

180. A method according to claim 179, wherein polishing the received semiconductor wafer includes a first polishing at a first station, transferring the received semiconductor wafer to a second station, and a second polishing at the second station.

181. A method according to claim 179, wherein rinsing the cleaned semiconductor wafer includes a water rinse.

182. A method according to claim 179, wherein cleaning the polished semiconductor wafer includes brushing.

183. A method according to claim 179, wherein cleaning is performed in a cleaning sub-station, and wherein rinsing is performed in a rinsing sub-station.

184. A method according to claim 179, wherein receiving a semiconductor wafer includes vertically moving the semiconductor wafer.

185. A method according to claim 179, further including protecting said semiconductor wafer from debris during cleaning, rinsing, and drying.

186. A method according to claim 179, further including measuring at least one semiconductor wafer parameter after cleaning.

187. A method according to claim 179, further including locally retaining polishing debris.

188. A method according to claim 180, wherein transferring the received semiconductor wafer to the second station includes moving the semiconductor wafer vertically.

189. A method according to claim 180, wherein transferring the polished semiconductor wafer from the polishing station to the cleaning station includes moving the semiconductor wafer vertically.

190. A method of polishing a semiconductor wafer, comprising:
receiving semiconductor wafers, each having a surface area, at a wafer load station;
selectively transferring semiconductor wafers from the wafer load station to a first CMP polishing station;
selectively transferring semiconductor wafers from the wafer load station to a second CMP polishing station;
polishing semiconductor wafers in the first CMP polishing station using a polishing pad and a chemical slurry, wherein the polishing pad contacts less than the surface area;
polishing semiconductor wafers in the second CMP polishing station using a polishing pad and a chemical slurry, wherein the polishing pad contacts less than the surface area;
transferring polished semiconductors from the first CMP polishing station to a first cleaning station;
transferring polished semiconductors from the second CMP polishing station to a second cleaning station;
cleaning polished semiconductor wafers at a first cleaning station;
cleaning polished semiconductor wafers at a second cleaning station;
unloading polished and cleaned semiconductor wafers station from the first cleaning station to a first unload station; and
unloading polished and cleaned semiconductor wafers station from the second cleaning station to a second unload station.

191. A method according to claim 190, wherein polishing semiconductor wafers in a first CMP polishing station includes moving the semiconductor wafers vertically.

192. A method according to claim 191, wherein polishing semiconductor wafers in a second CMP polishing station includes moving the semiconductor wafers vertically.

193. A method according to claim 190, wherein cleaning polished semiconductor wafers at the first cleaning station includes water rinsing.

194. A method according to claim 190, wherein cleaning polished semiconductor wafers at the first cleaning station includes brushing.

195. A method according to claim 190, wherein cleaning polished semiconductor wafers at the first cleaning station includes drying.

196. A method according to claim 190, wherein cleaning said semiconductor wafer includes cleaning in a cleaning sub-station, rinsing in a rinsing sub-station, and drying in a drying substation.

197. A method according to claim 190, wherein receiving semiconductor wafers includes moving semiconductor wafers vertically.

198. A method according to claim 190, further including protecting semiconductor wafers from debris during cleaning.

199. A method according to claim 190, further including measuring at least one semiconductor wafer parameter after cleaning.

200. A method according to claim 190, further including locally retaining polishing debris.

201. A method according to claim 190, wherein transferring polished semiconductors from the first CMP polishing station to the first cleaning station includes moving semiconductor wafers vertically.

202. A method according to claim 190, wherein unloading polished and cleaned semiconductor wafers station includes moving semiconductor wafers vertically.

203. A method according to claim 190, further including protecting said semiconductor wafers from debris during cleaning, rinsing, and drying.

204. A method according to claim 190, further including measuring at least one semiconductor wafer parameter in the first cleaning station after cleaning.

205. A method according to claim 190, further including locally retaining polishing debris produced in the first CMP polishing station.

206. A method of polishing a semiconductor wafer, comprising:
receiving semiconductor wafers, each having a surface area, at a wafer load station;
transferring received semiconductor wafers from the wafer load station to a buffer station;
temporarily retaining semiconductor wafers at the buffer station;
selectively transferring semiconductor wafers from the buffer station to a first CMP polishing station;
selectively transferring semiconductor wafers from the buffer station to a second CMP polishing station;
polishing semiconductor wafers in the first CMP polishing station using a polishing pad and a chemical slurry, wherein the polishing pad contacts less than the surface area;
polishing semiconductor wafers in the second CMP polishing station using a polishing pad and a chemical slurry, wherein the polishing pad contacts less than the surface area;
transferring polished semiconductors from the first CMP polishing station to a first cleaning station;
transferring polished semiconductors from the second CMP polishing station to a second cleaning station;
cleaning polished semiconductor wafers at the first cleaning station;
cleaning polished semiconductor wafers at the second cleaning station;
unloading polished and cleaned semiconductor wafers station from the first cleaning station to a first unload station; and
unloading polished and cleaned semiconductor wafers station from the second cleaning station to a second unload station.

207. A method according to claim 206, wherein polishing semiconductor wafers in the first CMP polishing station includes moving semiconductor wafers vertically.

208. A method according to claim 207, wherein polishing semiconductor wafers in the second CMP polishing station includes moving semiconductor wafers vertically.

209. A method according to claim 206, wherein cleaning polished semiconductor wafers at a first cleaning station includes water rinsing.

210. A method according to claim 206, wherein cleaning polished semiconductor wafers at a first cleaning station includes brushing.

211. A method according to claim 206, wherein cleaning polish ed semiconductor wafers at a first cleaning station includes drying.

212. A method according to claim 206, wherein cleaning said semiconductor wafer includes cleaning in a cleaning sub-station, rinsing in a rinsing sub-station, and drying in a drying substation.

213. A method according to claim 206, wherein receiving semiconductor wafers includes moving semiconductor wafers vertically.

214. A method according to claim 206, wherein transferring received semiconductor wafers from the wafer load station to a buffer station includes moving semiconductor wafers vertically.

215. A method according to claim 206, wherein selectively transferring semiconductor wafers from the buffer station to a first CMP polishing station includes moving semiconductor wafers vertically.

216. A method according to claim 206, further including protecting semiconductor wafers from debris during cleaning.

217. A method according to claim 206, further including measuring at least one semiconductor wafer parameter.

218. A method according to claim 206, further including locally retaining polishing debris.

219. A method according to claim 206, wherein transferring polished semiconductors from the first CMP polishing station to the first cleaning station includes moving semiconductor wafers vertically.

220. A method according to claim 206, wherein unloading polished and cleaned semiconductor wafers station from the first cleaning station to the first unload station includes moving semiconductor wafers vertically.

221. A method according to claim 206, further including locally retaining polishing debris produced in the first CMP polishing station.

222. A method according to claim 218, further including locally retaining polishing debris produced in the first CMP polishing station.

223. A method of polishing a semiconductor wafer, comprising:
receiving semiconductor wafers, each having a surface area, at a wafer load station;
transferring received semiconductor wafers from the wafer load station to a buffer station for temporary storage;
selectively transferring semiconductor wafers from the buffer station to a first CMP polishing station;
selectively transferring semiconductor wafers from the buffer station to a second CMP polishing station;
polishing semiconductor wafers in the first CMP polishing station using a polishing pad and a chemical slurry, wherein the polishing pad contacts less than the surface area;
polishing semiconductor wafers in the second CMP polishing station using a polishing pad and a chemical slurry, wherein the polishing pad contacts less than the surface area;
transferring semiconductor wafers from the first CMP polishing station to the buffer station for temporary storage;
transferring semiconductor wafers from the second CMP polishing station to the buffer station for temporary storage;
selectively transferring semiconductor wafers from the buffer station to a first cleaning station;
selectively transferring semiconductor wafers from the buffer station to a second cleaning station;
cleaning polished semiconductor wafers at a first cleaning station;
cleaning polished semiconductor wafers at a second cleaning station;
unloading cleaned and polished semiconductor wafers station from the first cleaning station to a first unload station; and
unloading cleaned and polished semiconductor wafers station from the second cleaning station to a second unload station.

224. A method according to claim 223, wherein polishing semiconductor wafers in the first CMP polishing station includes moving the semiconductor wafers vertically.

225. A method according to claim 224, wherein polishing semiconductor wafers in the second CMP polishing station includes moving the semiconductor wafers vertically.

226. A method according to claim 223, wherein cleaning polished semiconductor wafers at the first cleaning station includes water rinsing.

227. A method according to claim 223, wherein cleaning polished semiconductor wafers at the first cleaning station includes brushing.

228. A method according to claim 223, wherein cleaning polished semiconductor wafers at the first cleaning station includes drying.

229. A method according to claim 223, wherein cleaning said semiconductor wafers includes cleaning in a cleaning sub-station, rinsing in a rinsing sub-station, and drying in a drying substation.

230. A method according to claim 223, wherein receiving semiconductor wafers includes moving semiconductor wafers vertically.

231. A method according to claim 223, wherein transferring received semiconductor wafers from the wafer load station to the buffer station includes moving semiconductor wafers vertically.

232. A method according to claim 223, wherein selectively transferring semiconductor wafers from the buffer station to a first CMP polishing station includes moving semiconductor wafers vertically.

233. A method according to claim 232, wherein selectively transferring semiconductor wafers from the first CMP polishing station to the buffer station includes moving semiconductor wafers vertically.

234. A method according to claim 223, wherein selectively transferring semiconductor wafers from the buffer station to a first cleaning station includes moving semiconductor wafers vertically.

235. A method according to claim 223, further including protecting semiconductor wafers from debris during cleaning.

236. A method according to claim 223, further including measuring at least one semiconductor wafer parameter after cleaning.

237. A method according to claim 223, further including locally retaining polishing debris.

238. A method according to claim 223, wherein unloading polished and cleaned semiconductor wafers from the first cleaning station to the first unload station includes moving semiconductor wafers vertically.

239. A method of polishing a semiconductor wafer, comprising:

receiving semiconductor wafers, each having a surface area, at a wafer load station;

transferring received semiconductor wafers from the wafer load station to a buffer station;

temporarily retaining semiconductor wafers at the buffer station;

selectively transferring semiconductor wafers from the buffer station to a CMP polishing station;

polishing semiconductor wafers in the CMP polishing station using a polishing pad and a chemical slurry, wherein the polishing pad contacts less than the surface area;

transferring polished semiconductors from the CMP polishing station to a cleaning station;

cleaning polished semiconductor wafers at the cleaning station; and unloading polished and cleaned semiconductor wafers station from the cleaning station to an unload station.

240. A method according to claim 239, wherein polishing semiconductor wafers in the CMP polishing station includes moving the semiconductor wafers vertically.

241. A method according to claim 239, wherein cleaning polished semiconductor wafers includes water rinsing.

242. A method according to claim 239, wherein cleaning polished semiconductor wafers includes brushing.

243. A method according to claim 239, wherein cleaning polished semiconductor wafers includes drying.

244. A method according to claim 239, wherein cleaning said semiconductor wafers includes cleaning in a cleaning sub-station, rinsing in a rinsing sub-station, and drying in a drying substation.

245. A method according to claim 239, wherein receiving semiconductor wafers includes moving semiconductor wafers vertically.

246. A method according to claim 239, wherein transferring received semiconductor wafers from the wafer load station to a buffer station includes moving semiconductor wafers vertically.

247. A method according to claim 239, wherein selectively transferring semiconductor wafers from the buffer station to the CMP polishing station includes moving semiconductor wafers vertically.

248. A method according to claim 239, further including protecting semiconductor wafers from debris during cleaning.

249. A method according to claim 239, further including measuring at least one semiconductor wafer parameter after cleaning.

250. A method according to claim 239, further including locally retaining polishing debris.

251. A method according to claim 239, wherein transferring polished semiconductors from the CMP polishing station to the cleaning station includes moving semiconductor wafers vertically.

252. A method according to claim 239, wherein unloading polished and cleaned semiconductor wafers includes moving semiconductor wafers vertically.

253. A semiconductor wafer processing system, comprising:

a wafer load station for receiving semiconductor wafers;

a CMP polishing system for polishing semiconductor wafers, said CMP polishing system having a polishing pad with a contact surface for contacting a semiconductor wafer, wherein said contact surface has a contact area that is less than a surface area of a contacted semiconductor wafer;

a cleaning system for cleaning polished semiconductor wafers;

an unload station for receiving polished and cleaned semiconductor wafers;

a first robotic mover for moving semiconductor wafers from said wafer load station into said CMP polishing system, said first robotic mover further for moving polished semiconductor wafers from said CMP polishing system to said cleaning system; and a second robotic mover for moving cleaned semiconductor wafers from said cleaning system to said unload station.

254. A semiconductor wafer processing system according to claim 253, wherein said first robotic mover is mounted on a track.

255. A semiconductor wafer processing system according to claim 253, wherein said CMP polishing system is a multi-station CMP system having at least two mini-polishers.

256. A semiconductor wafer processing system according to claim 253, wherein said cleaning system includes at least two cleaning subsystems that are vertically stacked.

257. A semiconductor wafer processing system according to claim 256, wherein said cleaning system includes a water rinse.

258. A semiconductor wafer processing system according to claim 256, wherein said cleaning system includes a brush.

259. A semiconductor wafer processing system according to claim 256, wherein said cleaning system includes a wafer transfer mechanism for vertically moving semiconductor wafers.

260. A semiconductor wafer processing system according to claim 253, wherein said second robotic mover is disposed between said unload station and said multi-station cleaning system.

261. A semiconductor wafer processing system according to claim 253, wherein said wafer load station is adjacent said wafer unload station.

262. A semiconductor wafer processing system according to claim 253, wherein said first robotic mover is further for moving semiconductor wafers from one mini-polisher to another mini-polisher of said CMP polishing system.

263. A semiconductor wafer processing system according to claim 255, further including a vertical motion inducing device.

264. A semiconductor wafer processing system according to claim 255, wherein said cleaning system includes a housing.

265. A semiconductor wafer processing system according to claim 255, wherein said housing has a plurality of entrance ports.

266. A semiconductor wafer processing system according to claim 255, wherein said multi-station cleaning system includes a metrology station.

267. A semiconductor wafer processing system according to claim 253, wherein said CMP polishing system includes a housing.

268. A semiconductor wafer processing system according to claim 267, wherein said housing has an access port.

269. A semiconductor wafer processing system according to claim 253, wherein said cleaning system includes vertically stacked cleaning stations.

270. A semiconductor wafer processing system, comprising:

a wafer load station for receiving semiconductor wafers;

a CMP polishing system for polishing semiconductor wafers, said CMP polishing system having a polishing pad with a contact surface for contacting a semiconductor wafer, wherein said contact surface has a contact area that is less than a surface area of a contacted semiconductor wafer;

a cleaning system for cleaning polished semiconductor wafers;

a metrology station for measuring at least one parameter of cleaned semiconductor wafers;

an unload station for receiving cleaned, polished, and measured semiconductor wafers;

a first robotic mover for moving semiconductor wafers from said wafer load station into said CMP polishing system, said first robotic mover further for moving polished semiconductor wafers from said CMP polishing system to said cleaning system;

a second robotic mover for moving cleaned semiconductor wafers from said cleaning system to said metrology station; and a third robotic mover for moving cleaned semiconductor wafers from said metrology station to said unload station.

271. A semiconductor wafer processing system according to claim 270, wherein said first robotic mover is mounted on a track.

272. A semiconductor wafer processing system according to claim 270, wherein said CMP polishing system is a multi-station CMP system having at least two mini-polishers.

273. A semiconductor wafer processing system according to claim 270, wherein said cleaning system includes at least two vertically stacked cleaning subsystems.

274. A semiconductor wafer processing system according to claim 273, wherein said cleaning system includes a water rinse.

275. A semiconductor wafer processing system according to claim 273, wherein said cleaning system includes a brush.

276. A semiconductor wafer processing system according to claim 273, wherein said cleaning system includes a wafer transfer mechanism for vertically moving semiconductor wafers.

277. A semiconductor wafer processing system according to claim 270, wherein said second robotic mover is disposed between said metrology station and said cleaning system.

278. A semiconductor wafer processing system according to claim 270, wherein said wafer load station is adjacent said wafer unload station.

279. A semiconductor wafer processing system according to claim 270, further including a vertical motion inducing device.

280. A semiconductor wafer processing system according to claim 270, wherein said cleaning system includes a housing.

281. A semiconductor wafer processing system according to claim 280, wherein said housing has a plurality of entrance ports.

282. A semiconductor wafer processing system according to claim 270, wherein said CMP polishing system includes a housing.

283. A semiconductor wafer processing system according to claim 270, wherein said first robotic mover runs along a track that is between said CMP polishing system and said cleaning system.

* * * * *